(12) United States Patent
Iwasaki et al.

(10) Patent No.: US 11,971,453 B2
(45) Date of Patent: Apr. 30, 2024

(54) BATTERY STATE DETECTION DEVICE

(71) Applicants: FURUKAWA ELECTRIC CO., LTD., Tokyo (JP); FURUKAWA AUTOMOTIVE SYSTEMS INC., Inukami-gun (JP); TOYOTA JIDOSHA KABUSHIKI KAISHA, Toyota (JP)

(72) Inventors: Jun Iwasaki, Seto (JP); Ryosuke Takahashi, Nagakute (JP); Kazuya Kato, Toyota (JP); Keita Saji, Inukami-gun (JP); Ryusuke Kakoi, Inukami-gun (JP)

(73) Assignees: FURUKAWA ELECTRIC CO., LTD., Tokyo (JP); FURUKAWA AUTOMOTIVE SYSTEMS INC., Inukami-gun (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 223 days.

(21) Appl. No.: 17/448,749

(22) Filed: Sep. 24, 2021

(65) Prior Publication Data
US 2022/0011367 A1 Jan. 13, 2022

Related U.S. Application Data

(63) Continuation of application No. PCT/JP2020/015604, filed on Apr. 7, 2020.

(30) Foreign Application Priority Data

Apr. 9, 2019 (JP) .................................. 2019-073920
Apr. 11, 2019 (JP) .................................. 2019-075240

(51) Int. Cl.
*G01R 31/382* (2019.01)
*G01R 31/364* (2019.01)
(Continued)

(52) U.S. Cl.
CPC ......... *G01R 31/364* (2019.01); *G01R 31/382* (2019.01); *H01M 10/48* (2013.01); *H01M 50/569* (2021.01)

(58) Field of Classification Search
CPC ... G01R 31/392; G01R 31/367; H02J 7/0068; H01M 10/4285; H01M 10/44
(Continued)

(56) References Cited

U.S. PATENT DOCUMENTS 6,222,439 B1 4/2001 Tanigawa et al.
2004/0008503 A1 1/2004 Higuchi et al.
(Continued)

FOREIGN PATENT DOCUMENTS

JP 11-232977 A 8/1999
JP 2004-047187 A 2/2004
(Continued)

OTHER PUBLICATIONS

Written Opinion of the International Searching Authority dated Jun. 30, 2020 in PCT/JP2020/015604 (submitting English translations only). 4 pages.
(Continued)

*Primary Examiner* — Lee E Rodak
*Assistant Examiner* — Trung Q Nguyen
(74) *Attorney, Agent, or Firm* — Oblon, McClelland, Maier & Neustadt, L.L.P.

(57) ABSTRACT

A battery state detection device including a battery post terminal, a case accommodating a circuit board including a current sensing circuit that senses a current by being electrically connected to the battery post terminal, and a harness connection part provided on the case, the harness connection part being capable of having a harness connected thereto, in which the battery post terminal includes a holding part held on one of faces of the case, and an insert part provided in a
(Continued)

region from the holding part along a face adjacent to the one of the faces of the case, the battery post terminal contacts the case via at least two faces, the two faces including the one of the faces and the face adjacent to the one of the faces, and the case includes a fitting part, the fitting part being adapted to fit around the insert part by accommodating the insert part.

14 Claims, 16 Drawing Sheets

(51) Int. Cl.
    *H01M 10/48*     (2006.01)
    *H01M 50/569*     (2021.01)

(58) Field of Classification Search
    USPC .. 324/415, 437, 425–435, 126, 756.05, 538, 324/200, 207.13, 233, 256, 515, 500–530, 324/76.11
    See application file for complete search history.

(56) References Cited

U.S. PATENT DOCUMENTS

| | | |
|---|---|---|
| 2005/0242917 A1 | 11/2005 | Higuchi et al. |
| 2016/0099487 A1* | 4/2016 | Takeuchi ............ H01M 50/569 29/730 |
| 2016/0139209 A1 | 5/2016 | Tanaka et al. |

FOREIGN PATENT DOCUMENTS

| | | | | |
|---|---|---|---|---|
| JP | 2011-181297 A | | 9/2011 | |
| JP | 2014-143123 A | | 8/2014 | |
| JP | 2014134123 A | * | 8/2014 | ............ H01M 2/30 |
| WO | WO 2014/199576 A1 | | 12/2014 | |
| WO | WO 2014/203465 A1 | | 12/2014 | |

OTHER PUBLICATIONS

International Search Report and Written Opinion in PCT/JP2020/015604 (submitting English translations only), 5 pages.
International Search Report dated Jun. 30, 2020 in PCT/JP2020/015604 filed on Apr. 7, 2020, 5 pages (with English Translation).

* cited by examiner

BATTERY STATE DETECTION DEVICE

CROSS REFERENCE TO RELATED APPLICATIONS

The present application is a continuation application of International Application No. PCT/JP2020/015604, filed on Apr. 7, 2020, which claims priority to Japanese Patent Application No. 2019-073920, filed on Apr. 9, 2019 and Japanese Patent Application No. 2019-075240, filed on Apr. 11, 2019. The contents of these applications are incorporated herein by reference in their entirety.

BACKGROUND

Technical Field

The present invention relates to a battery state detection device.

Background Art

A battery state detection device is known that detects the state of a battery mounted on a vehicle, such as an automobile. The battery state detection device includes components, such as a shunt resistor and a circuit board, for sensing a current. Among battery state detection devices, those having a case for accommodating a circuit board, for example, are known (for example, see Patent Literature 1: International Publication No. 2014/203465).

Typically, a battery mounted on a vehicle has a battery post projecting from the upper face of the battery, and the battery post has a battery post terminal fixed thereto. The battery post terminal has power supply harnesses connected thereto. A battery state detection device is connected between the battery post terminal and the harnesses. In such a case, the battery state detection device is fixed to the battery post terminal.

By the way, regarding the conventional battery state detection device, there is a case where an operator holds the case of the battery state detection device when detaching the battery post terminal for replacing a battery.

However, in the conventional battery state detection device, in such a case, a load may be applied to a portion of the case in contact with the battery post terminal.

The present invention has been made in view of the foregoing problem, and it is an object of the present invention to provide a battery state detection device in which the durability of a case can be improved.

SUMMARY

A battery state detection device according to a representative embodiment of the present invention is a battery state detection device including a battery post terminal, a case accommodating a circuit board including a current sensing circuit that senses a current by being electrically connected to the battery post terminal, and a harness connection part provided on the case, the harness connection part being capable of having a harness connected thereto, in which the battery post terminal includes a holding part held on one of faces of the case, and an insert part provided in a region from the holding part along a face adjacent to the one of the faces of the case, the battery post terminal contacts the case via at least two faces, the two faces including the one of the faces and the face adjacent to the one of the faces, and the case includes a fitting part, the fitting part being adapted to fit around the insert part by accommodating the insert part.

According to a battery state detection device according to the present invention, the durability of a case can be improved.

DETAILED DESCRIPTION

Hereinafter, battery state detection devices 1 and 1B according to embodiments of the present invention will be described with reference to the drawings.

Hereinafter, a direction parallel with a direction along the side face of each of a battery post terminal 10 of the battery state detection device 1 in FIG. 1 and a battery post terminal 10B of the battery state detection device 1B in FIG. 12, that is, the direction of the axis of each of battery posts (not illustrated) held by the battery post terminals 10 and 10B (hereinafter also referred to as an axis direction) will be assumed as the z-axis direction for convenience sake. The axis direction is also referred to as the up-down direction. One of directions perpendicular to the axis of each of the battery state detection devices 1 and 1B (i.e., the x-axis direction) is assumed as the right-left direction. The x-axis direction is also the horizontal direction of the battery state detection devices 1 and 1B. In addition, the other of the directions perpendicular to the axis of each of the battery state detection devices 1 and 1B (i.e., the y-axis direction) is assumed as the front-rear direction. In the battery state detection devices 1 and 1B, the −y-direction is also referred to as the front side, and the +y-direction is also referred to as the rear side. Further, the direction of each of the battery state detection devices 1 and 1B seen from the −y-direction toward the +y-direction is assumed as the front direction. In the following description, when the positional relationship or direction of each component is described as the right side, left side, front side, rear side, upper side, or lower side, it means only the positional relationship or direction of the component on the drawings, and does not limit the actual positional relationship or direction in the battery state detection device.

First Embodiment

[Schematic Configuration of Battery State Detection Device]

Figure 1:
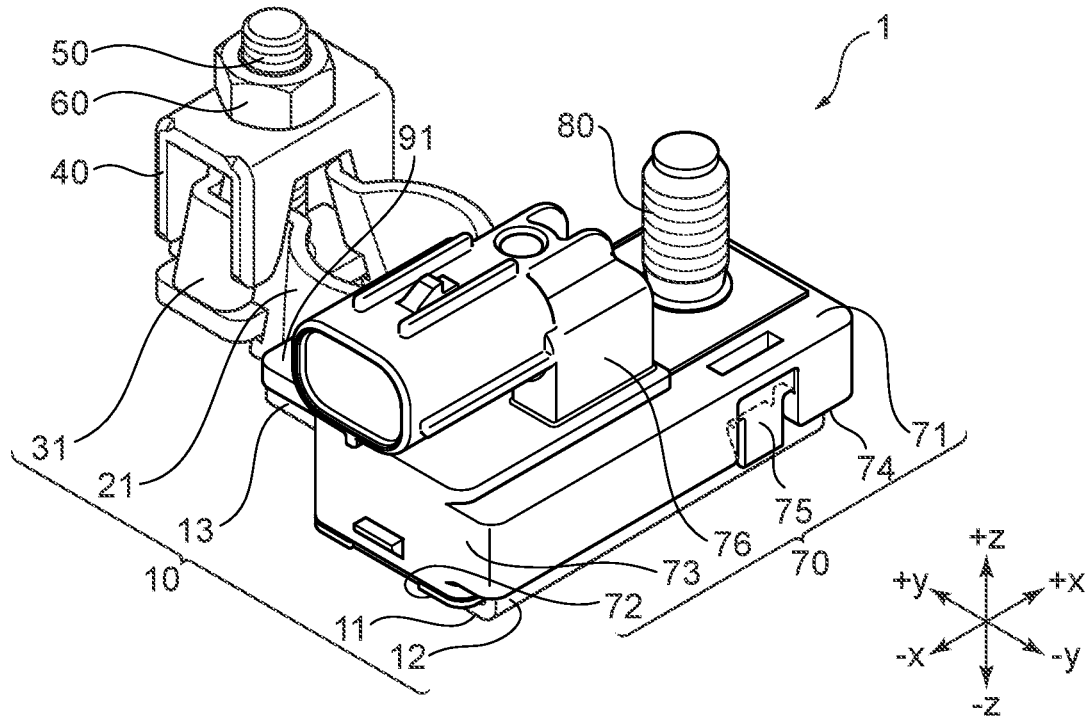
FIG. 1 A perspective view of a battery state detection device according to a first embodiment.
Figure 2:
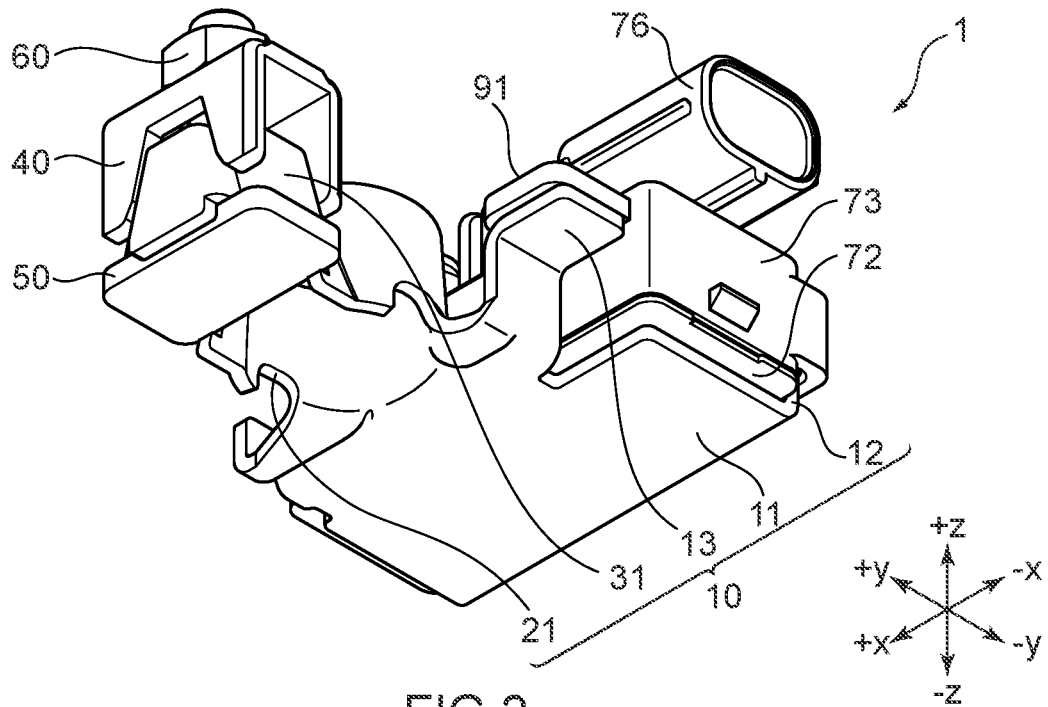
FIG. 2 A perspective view of the battery state detection device according to the first embodiment.
Figure 3:
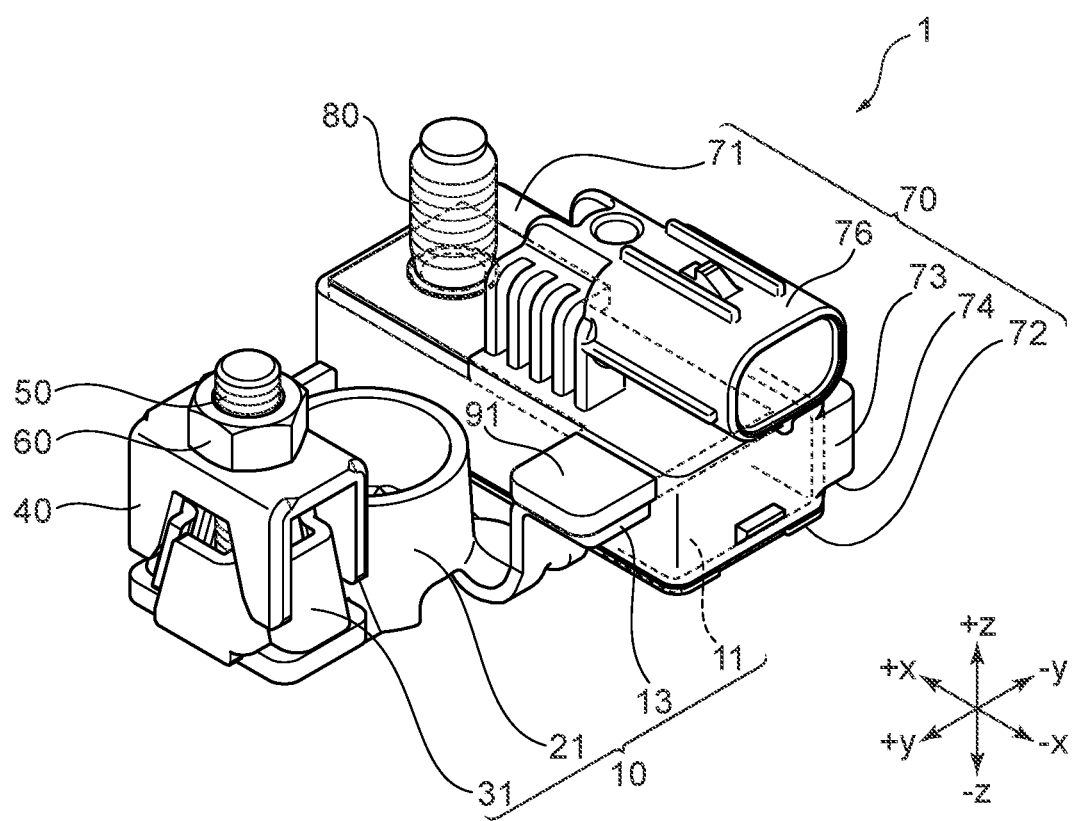
FIG. 3 A perspective view of the battery state detection device according to the first embodiment.
Figure 4:
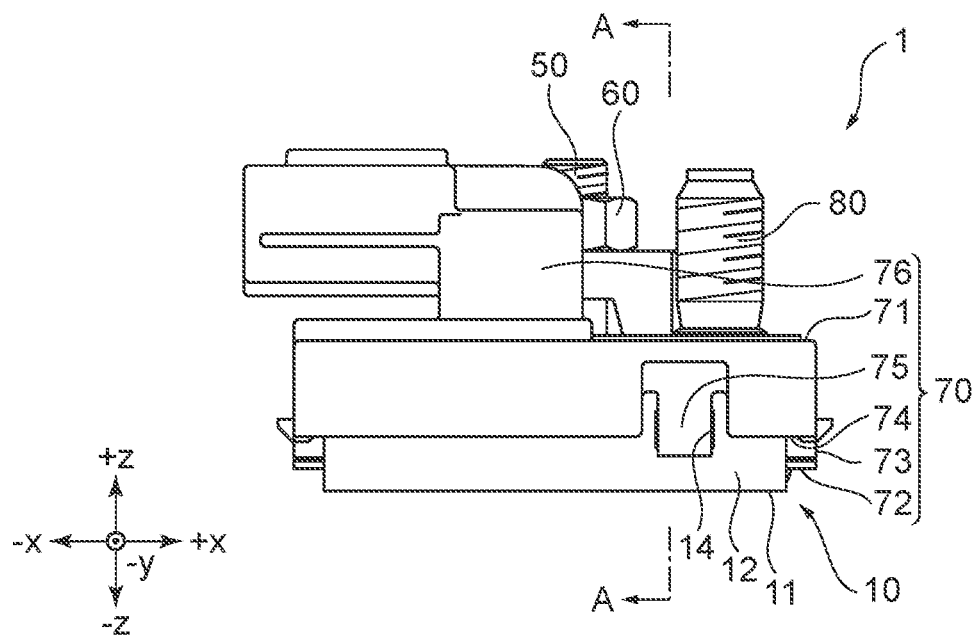
FIG. 4 A front view of the battery state detection device according to the first embodiment.
Figure 5:
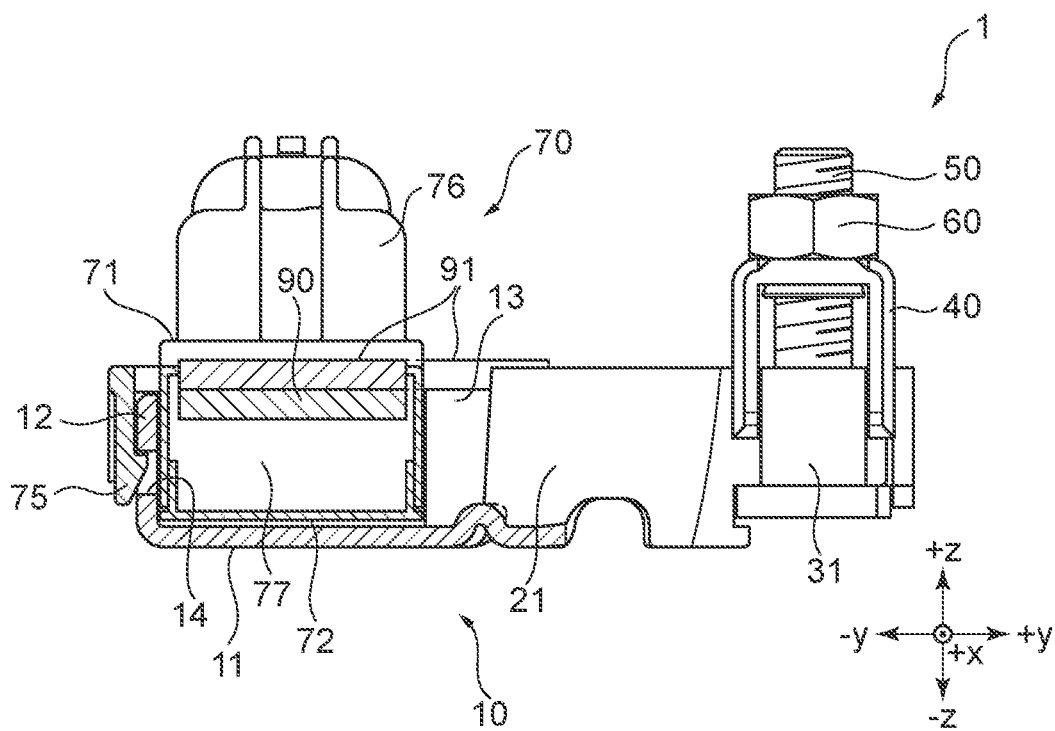
FIG. 5 An A-A cross-sectional view of the battery state detection device according to the first embodiment.

FIGS. 1 to 3 are perspective views of a battery state detection device 1 according to a first embodiment. FIG. 4 is a front view of the battery state detection device 1. FIG. 5 is an A-A cross-sectional view of the battery state detection device 1.

As illustrated in FIGS. 1 to 5, the battery state detection device 1 includes a battery post terminal 10, a case 70, which accommodates a circuit board including a current sensing circuit that senses a current by being electrically connected to the battery post terminal 10, and a harness connection part 80 that is provided on the case 70 and to which a harness can be connected. The battery post terminal 10 includes a holding part 11 held on one of the faces (for example, a bottom portion 72) of the case 70, and an insert part 12 provided in a region from the holding part 11 along a face adjacent to one of the faces (for example, an upper face portion 71) of the case 70. The battery post terminal 10 contacts the case 70 via at least two faces including one of the faces and a face adjacent thereto of the case 70. The case 70 includes a fitting part 74 that fits around the insert part 12 by accommodating the insert part 12. Hereinafter, the battery state detection device 1 will be specifically described.

[Configuration of Case]

A specific configuration of the case 70 will be described.

Figure 6:
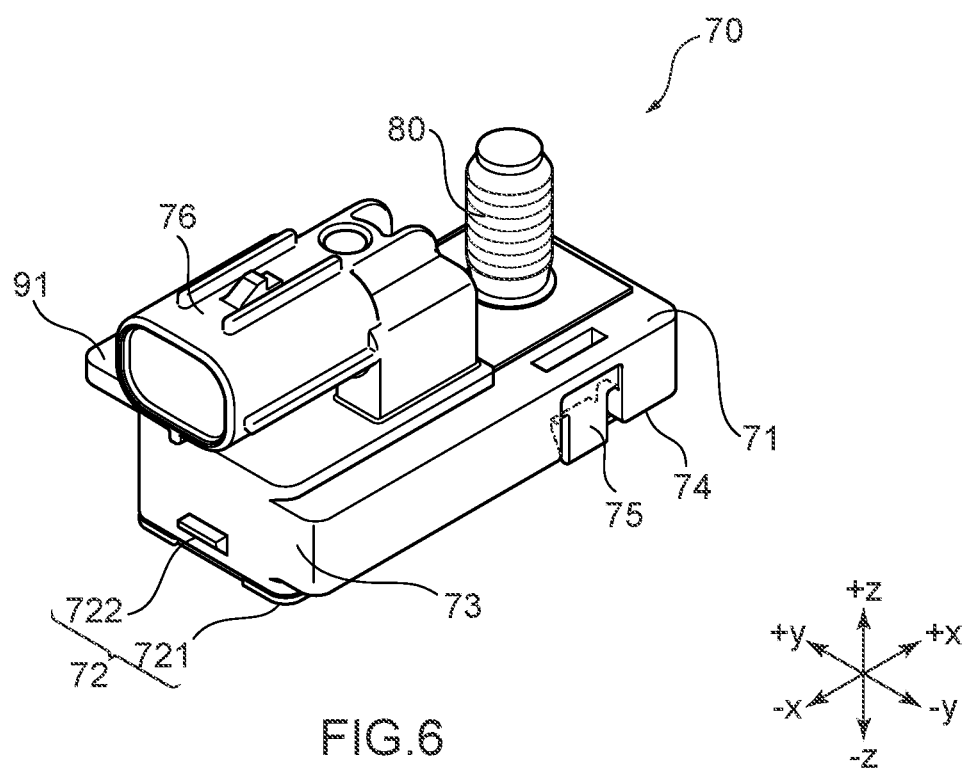
FIG. 6 A perspective view of a case of the battery state detection device according to the first embodiment.
Figure 7:
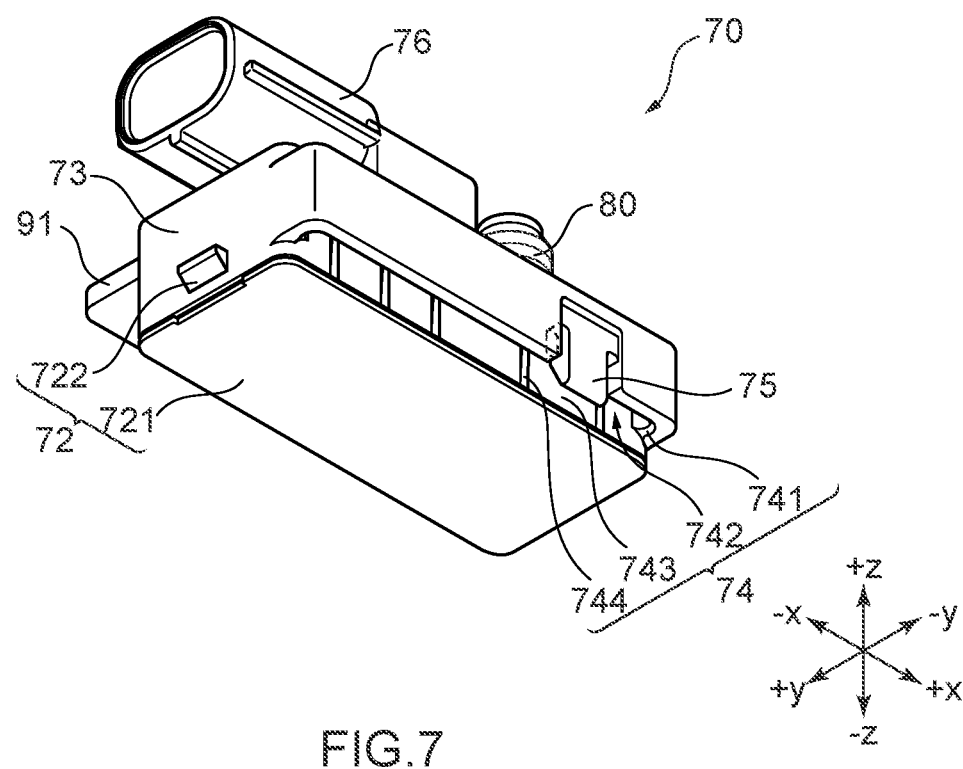
FIG. 7 A perspective view of the case of the battery state detection device according to the first embodiment.
Figure 8:
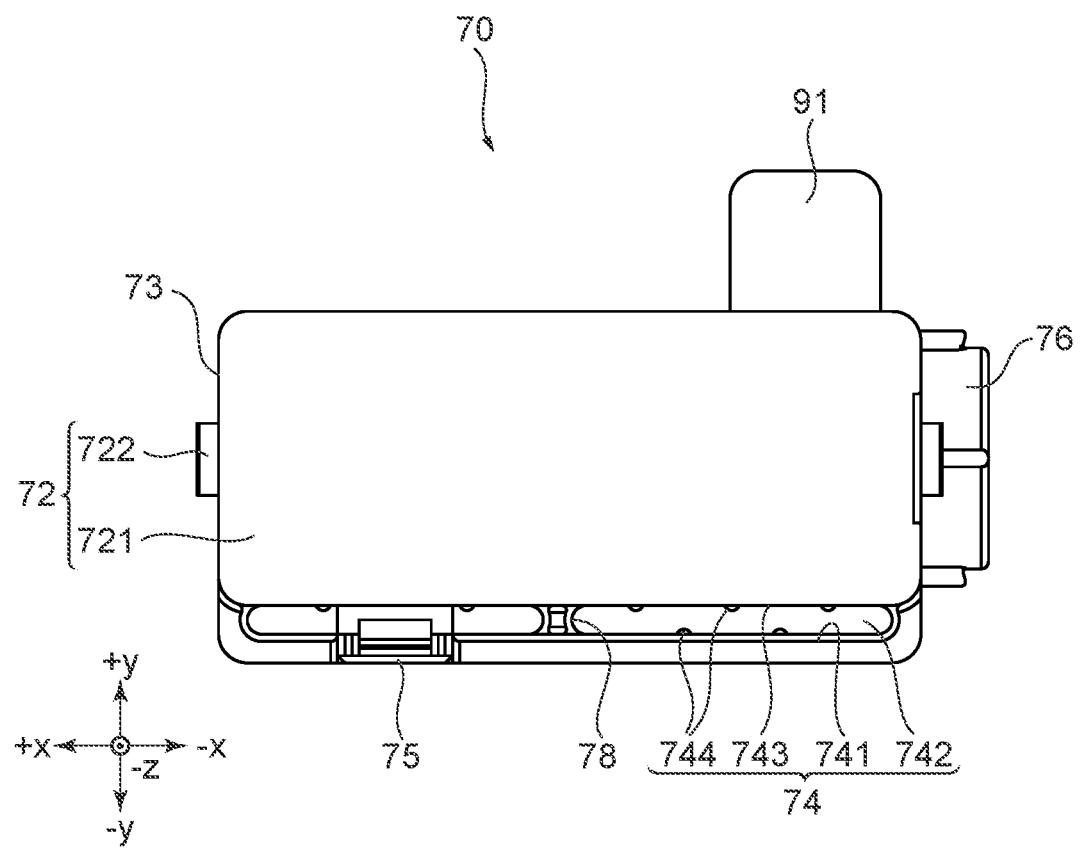
FIG. 8 A bottom view of the case of the battery state detection device according to the first embodiment.

FIGS. 6 and 7 are perspective views of the case 70 of the battery state detection device 1. FIG. 8 is a bottom view of the case 70 of the battery state detection device 1. The case 70 includes an upper face portion 71, a bottom portion 72, a side face portion 73, the fitting part 74, a locking part 75, a connector part 76, and a first rib 78. The case 70 has an internal space (i.e., a substrate accommodating part 77; see FIG. 5) surrounded by the upper face portion 71, the bottom portion 72, and the side face portion 73. The case 70 is open on the side of the bottom portion 72, and the substrate accommodating part 77 communicates with the outside through the opening. When the bottom portion 72 is fixed to the portion of the opening of the case 70 on the side of the bottom portion 72, the substrate accommodating part 77 is closed from the outside. The case 70 is formed in the shape of a substantially rectangular parallelepiped box, for example. The case 70 is made of resin, for example.

As illustrated in FIG. 5, the substrate accommodating part 77 of the case 70 accommodates a circuit board 90 including a current sensing circuit that senses a current by being electrically connected to the battery post terminal 10. The circuit board 90 has a shunt resistor 91 having disposed therein a resistive element (for example, Manganin) with a known resistance value. The shunt resistor 91 is electrically connected to the circuit board 90, and is partially exposed to the outside of the case 70 through the side face portion 73 on the rear side in FIG. 1 of the case 70. The shunt resistor 91 is electrically connected to the battery post terminal 10 via a shunt resistor connection part 13 of the battery post terminal 10.

As illustrated in FIGS. 6 to 8, the upper face portion 71 forms the upper face of the case 70 formed in the shape of a box. The upper face portion 71 has the connector part 76 formed thereon. In addition, the upper face portion 71 has the harness connection part 80 to which a harness (not illustrated) can be connected. It should be noted that the connector part 76 may be molded either integrally with or separately from the upper face portion 71.

The bottom portion 72 is provided in the bottom face of the case 70 formed in the shape of a box, that is, provided facing the upper face portion 71 on the side below the upper face portion 71. The bottom portion 72 is formed in a rectangular or substantially rectangular shape as seen from below. The bottom portion 72 closes the opening (not illustrated) provided on the lower side of the case 70. The bottom portion 72 includes a bottom portion body 721 formed in a flat or substantially flat shape, for example, and a claw part 722 provided on the side face of the bottom portion body 721 on the short-side side. The claw part 722 is inserted into an insertion hole (not illustrated) provided in the side face portion 73 on the short-side side, thereby fixing the bottom portion 72 in the aforementioned opening of the case 70.

The side face portion 73 forms the side face of the case 70 formed in the shape of a box. The side face portion 73 is provided continuously with the upper face portion 71 so as to surround the outer periphery of the upper face portion 71. The side face portion 73 has on its front side the fitting part 74 into which the insert part 12 of the battery post terminal 10 is insertable, for example. A terminal of the shunt resistor 91 is exposed to the outside through the side face portion 73 on the rear side. In addition, the side face portion 73 has on its short-side side an insertion hole (not illustrated) into which the aforementioned claw part 722 is adapted to be inserted, for example.

The fitting part 74 is provided on the side face portion 73 of the case 70, specifically, on the side face portion 73 on the front side. The fitting part 74 includes an opening 741, an accommodating part 742, and the locking part 75.

The opening 741 is open to the lower side of the case 70. The accommodating part 742 is adapted to have the insert part 12 of the battery post terminal 10 inserted therein as illustrated in FIGS. 1 to 5. Therefore, the accommodating part 742 is formed in the shape of a recessed groove with a predetermined depth so that the accommodating part 742 can accommodate the insert part 12.

The locking part 75 is locked in a fixation hole 14 of the insert part 12 inserted in the accommodating part 742, thereby fixing the battery post terminal 10 and the case 70 together. The locking part 75 is provided at a position facing the fixation hole 14 of the insert part 12 in a state in which the insert part 12 is accommodated in the accommodating part 742. Specifically, the locking part 75 is formed in the shape of a claw extending to the inner side of the case 70, that is, the inner side of the accommodating part 742 so as to be locked in the fixation hole 14 provided in the insert part 12.

The first rib 78 extends from the substrate accommodating part 77 to the fitting part 74 on the inner side of the upper face portion 71. The first rib 78 is provided to reinforce the upper face portion 71 of the case 70.

The harness connection part 80 is provided for connection of a harness (not illustrated) for electrical components. The shape and position of the harness connection part 80 are not particularly limited in the battery state detection device 1.

[Configuration of Battery Post Terminal]

Next, a specific configuration of the battery post terminal 10 will be described.

Figure 9:
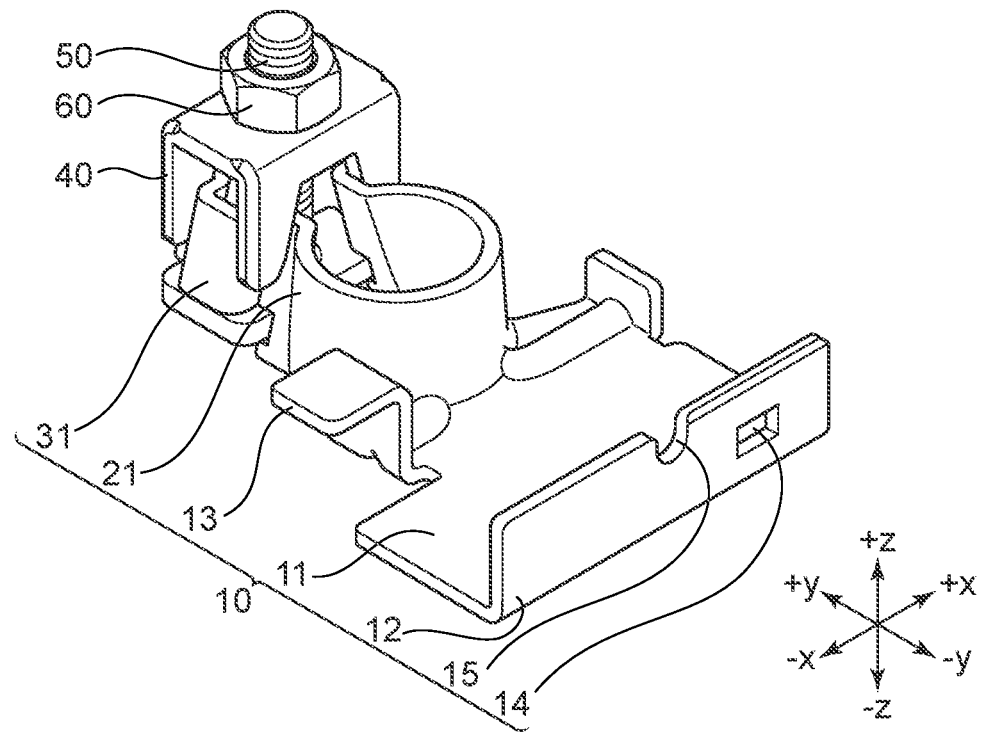
FIG. 9 A perspective view of a battery post terminal of the battery state detection device according to the first embodiment.
Figure 10:
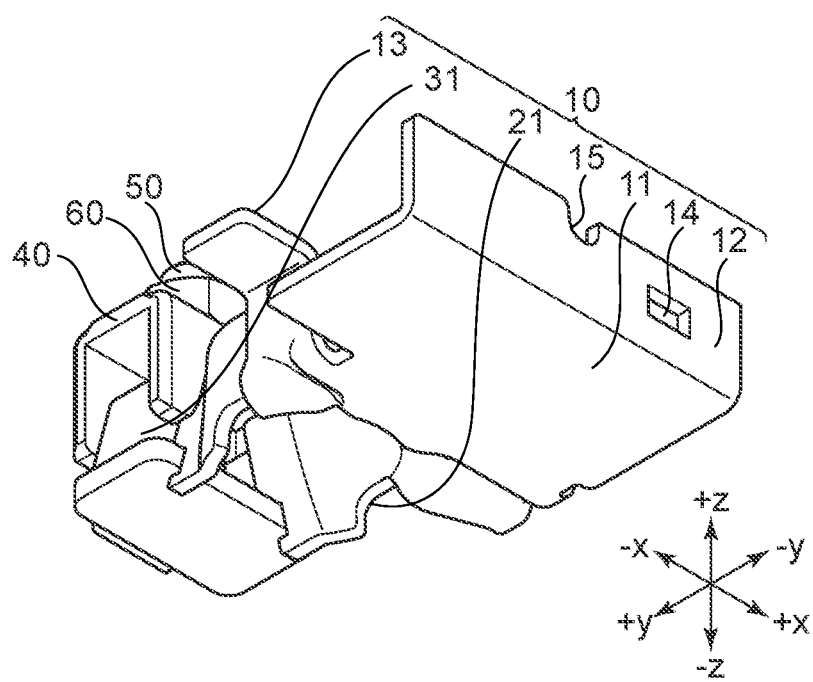
FIG. 10 A perspective view of the battery post terminal of the battery state detection device according to the first embodiment.

FIGS. 9 and 10 are perspective views of the battery post terminal 10 of the battery state detection device 1. The battery post terminal 10 has a sloped member 40 fastened thereto with a bolt 50 and a nut 60 as a fastening member in the up-down direction. The battery post terminal 10 is formed of a conductive metal material. The battery post terminal 10 includes the holding part 11 located on the front side in FIG. 9, the insert part 12 located on the front side of the holding part 11, and the shunt resistor connection part 13 located on the rear side of the holding part 11. In addition, the battery post terminal 10 includes an electrode fitting part 21 located on the rear side of the shunt resistor connection part 13, and a fixation part 31 located on the rear side of the electrode fitting part 21. In the battery post terminal 10, the holding part 11, the insert part 12, the shunt resistor connection part 13, the fixation hole 14, the electrode fitting part 21, and the fixation part 31 are integrally formed.

The holding part 11 held on the bottom portion 72 of the case 70 of the battery state detection device 1 so as to cover the bottom portion 72 is formed in a shape corresponding to the shape of the bottom portion 72, for example, in a rectangular or substantially rectangular shape. More specifically, the holding part 11 has a shape corresponding to the shape of the bottom face of the case 70 so as to cover the bottom portion 72 and the outer periphery of the bottom face of the case 70. With such a shape, the holding part 11 holds the entire bottom face of the case 70. The holding part 11 can be formed in any shape in conformity with the shape of the bottom portion 72 of the case 70. The holding part 11 also serves as a structural member that supports the case 70.

The insert part 12 is a standing wall-like member extending in the direction of the upper face portion 71 from an end portion on the front side of the holding part 11 along the side face portion 73 of the case 70 disposed above the holding part 11. The insert part 12 is integrally formed with the holding part 11, for example. The insert part 12 has a cutout part 15 at its end portion. The cutout part 15 is provided at a position facing the first rib 78 (see FIG. 8) provided in the accommodating part 742 of the fitting part 74 of the case 70.

The shunt resistor connection part 13 is provided such that it extends upward from the position of the holding part 11. The shunt resistor connection part 13 has a flat face along the horizontal direction, and the face is electrically connected to the shunt resistor 91 that is exposed to the outside of the case 70 by extending outward through the side face portion 73 on the rear side in FIG. 1 of the case 70. The shunt resistor connection part 13 is provided at a position facing the side face portion 73 on the rear face side of the case 70, for example. In the battery state detection device 1, the shunt resistor connection part 13 and the shunt resistor 91 are electrically connected, so that the battery and the harness (which are not illustrated) are electrically connected.

The fixation hole 14 is a hole provided in the insert part 12. The fixation hole 14 is provided at a position facing the locking part 75 when the insert part 12 is inserted into the fitting part 74. The fixation hole 14 is adapted to have the locking part 75 locked therein and thus have the locking part 75 fixed therein. In the battery state detection device 1, as the fixation hole 14 of the battery post terminal 10 and the locking part 75 of the case 70 engage each other, the case 70 is fixed to the battery post terminal 10.

The electrode fitting part 21 fixes the battery post terminal 10 to the battery post (not illustrated). The electrode fitting part 21 is formed in a substantially frustum shape having an internal space in conformity with the shape of the battery post that is in a substantially frustum shape. The electrode fitting part 21 has formed in its center a circular fitting hole penetrating the space in the up-down direction. The inner peripheral surface of the electrode fitting part 21 is inclined so as to be in surface contact with the inclined outer peripheral surface of the battery post. In addition, the inner peripheral surface of the electrode fitting part 21 has a plurality of grooves with gaps therebetween in the circumferential direction, thereby increasing a fastening force for receiving the outer peripheral surface of the battery post. The electrode fitting part 21 is attached to the battery post such that the inner peripheral surface of the electrode fitting part 21 is covered from the upper side of the battery post.

Although the electrode fitting part 21 is formed integrally and continuously with the holding part 11 at a portion on the rear side, the electrode fitting part 21 at a portion on the front side is branched (or split) to the right and left across its inner peripheral surface. The fixation part 31 is formed such that it extends to the front side from each of the distal end portions of the electrode fitting part 21 branched to the right and left.

The fixation part 31 is formed such that it extends to the front side from the right and left sides of the electrode fitting part 21 and can accommodate a threaded portion of the bolt 50 therein. The fixation part 31 has the sloped member 40 attached thereto such that the fixation part 31 is covered with the sloped member 40 from above.

The sloped member 40 has four leg portions extending downward from four corners of a substantially quadrangular upper face portion, and an insertion hole provided in the center of the upper face portion. The sides of the upper face portion are shorter in the front-rear direction than in the right-left direction. The insertion hole is adapted to have the threaded portion of the bolt 50 described below inserted therethrough. The right and left inner sides of each leg portion are sloped. Such slops are formed at the same inclination angle as the inclined plane of the fixation part 31, and thus, the inclined plane and the slopes are in surface contact with each other in a state in which the sloped member 40 is attached to the fixation part 31.

The bolt 50 includes, as illustrated in FIG. 1, the threaded portion extending in the up-down direction, and a head portion located on the lower side of the threaded portion. The threaded portion has formed thereon a screw thread in the range of a predetermined length from the distal end portion of the threaded portion facing upward.

[Function of Battery State Detection Device]

Next, the function of the battery state detection device 1 in the first embodiment will be described.

Figure 11:
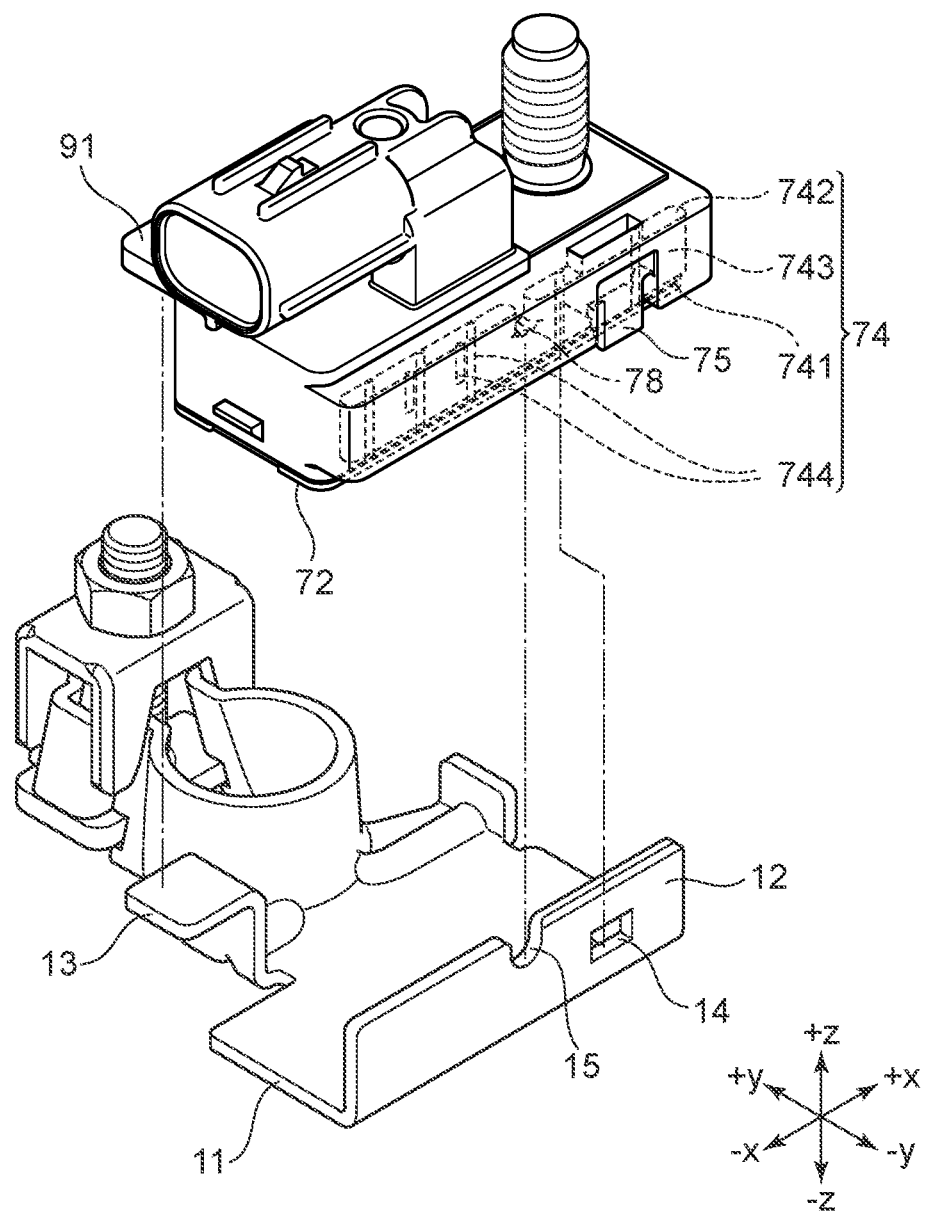
FIG. 11 An exploded perspective view of the battery state detection device according to the first embodiment.

FIG. 11 is an exploded perspective view of the battery state detection device 1. FIG. 12 is an exploded perspective view of the battery state detection device 1.

Figure 12:
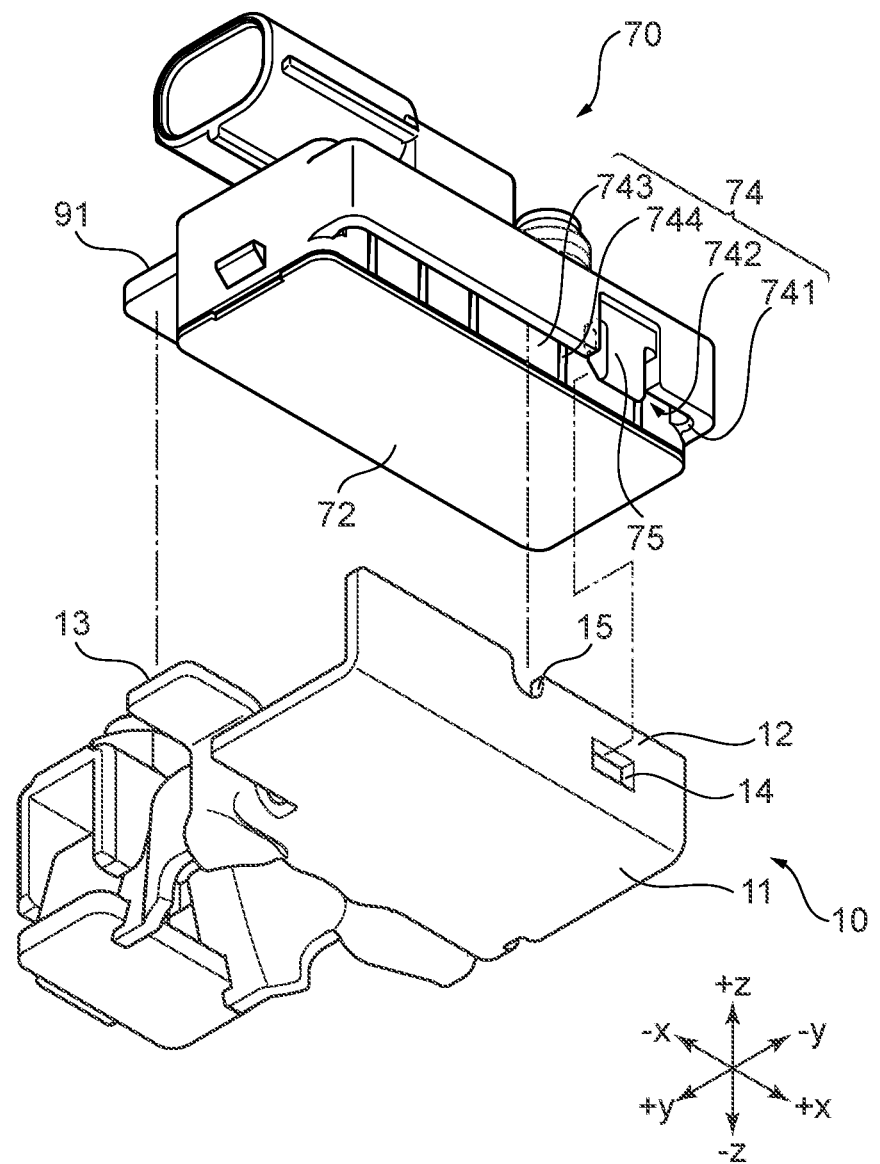
FIG. 12 An exploded perspective view of the battery state detection device according to the first embodiment.

As illustrated in FIGS. 11 and 12, in the battery state detection device 1, when the case 70 is attached to the battery post terminal 10, the insert part 12 is accommodated in the accommodating part 742, so that the case 70 is fixed to the battery post terminal 10. At this time, the bottom portion 72 of the case 70 holds the holding part 11 of the battery post terminal 10.

More specifically, the insert part 12 is accommodated in the accommodating part 742 through the opening 741. When the insert part 12 is accommodated in the accommodating part 742, the locking part 75 provided on the fitting part 74 is locked in the fixation hole 14 provided in the insert part 12. In the accommodating part 742, the position of the cutout part 15 provided at the distal end portion corresponds to the position of the first rib 78 provided on the inner side of the case 70. Therefore, the insert part 12 is reliably accommodated in the accommodating part 742.

With the aforementioned structure, in the battery state detection device 1, the bottom portion 72, which is the lower face portion, of the case 70 is held such that it is covered with the holding part 11 provided in the battery post terminal 10 made of metal. According to such a configuration, the battery state detection device 1 can, when an operator detaches the battery state detection device 1 from the battery by holding the case 70, receive a force of detaching the battery state detection device 1 with the holding part 11 made of metal. Specifically, according to the aforementioned battery state detection device 1, a load applied when the battery state detection device 1 is detached from the battery can be distributed to the portion of the bottom portion 72 held by the holding part 11, specifically, to the outer peripheral portion of the bottom portion 72 of the case 70. Thus, according to the aforementioned battery state detection device 1, a load is less likely to be applied to the case 70 made of resin, and thus, the durability of the case 70 can be improved.

In addition, in the battery state detection device 1, the insert part 12 of the battery post terminal 10 is accommodated in the accommodating part 742 of the fitting part 74 of the case 70. Therefore, according to the battery state detection device 1, a load applied when the battery state detection device 1 is detached from the battery can also be distributed to portions other than the portion of the bottom portion 72 held by the holding part 11.

Further, in the battery state detection device 1, the fixation hole 14 provided in the insert part 12 of the battery post terminal 10, and the locking part 75 provided in the case 70 are held. Therefore, according to the battery state detection device 1, even when a load is applied to the case 70 while the battery state detection device 1 is detached from the battery, the case 70 can be prevented from falling off the battery post terminal 10 and thus being damaged.

Although the battery state detection device 1 according to the first embodiment of the present invention has been described above, the present invention is not limited thereto, and can be modified and changed in a variety of ways based on the technical idea of the present invention.

The shape of the holding part 11 of the battery post terminal 10 is not limited to the aforementioned rectangular or substantially rectangular shape, and it is acceptable as long as the holding part 11 has a shape corresponding to the shape of the bottom portion 72 so that the holding part 11 is held at the outer peripheral portion of the bottom portion 72 of the case 70 and can distribute a force applied to the holding part 11 from the case 70. In addition, the holding part 11 need not be an entirely flat plate without irregularities, and may be partially provided with holes or irregularities, for example. The shape of the insert part 12 is not limited to the aforementioned shape as long as the insert part 12 can be inserted into the fitting part 74 of the case 70.

The shape of the fitting part 74 of the case 70 is not limited to the aforementioned shape, and it is acceptable as long as the fitting part 74 has a shape corresponding to the shape of the insert part 12 so that the fitting part 74 can fit around the insert part 12. In addition, the positions and shapes of the fixation hole 14 and the cutout part 15 are not limited to the aforementioned shapes, either.

In the fitting part 74 of the case 70, an inner wall part 743 may have second ribs 744 at positions facing the insert part 12 in a state in which the insert part 12 is accommodated in the fitting part 74. The second ribs 744 are crush ribs, and the distance therebetween in the y-axis direction on the opposite sides of the inner wall part 743 is the same as or slightly smaller than the plate thickness of the insert part 12. Therefore, when the insert part 12 is accommodated in the accommodating part 742 of the fitting part 74, the second ribs 744 are scraped or squashed as the insert part 12 is press-fitted, so that the insert part 12 can be held more securely. The second ribs 744 are preferably triangular or semi-circular in shape, for example, as seen in a cross-sectional view, but the shapes of the second ribs 744 are not limited thereto.

The battery post terminal 10 may include the electrode fitting part 21, the fixation part 31, the sloped member 40, the bolt 50, and the nut 60 with configurations different from those described above.

In addition, the case 70 may include the connector part 76 with a configuration different from that described above.

Second Embodiment

Hereinafter, a battery state detection device 1B according to a second embodiment of the present invention will be described with reference to the drawings.

[Schematic Configuration of Battery State Detection Device]

Figure 15:
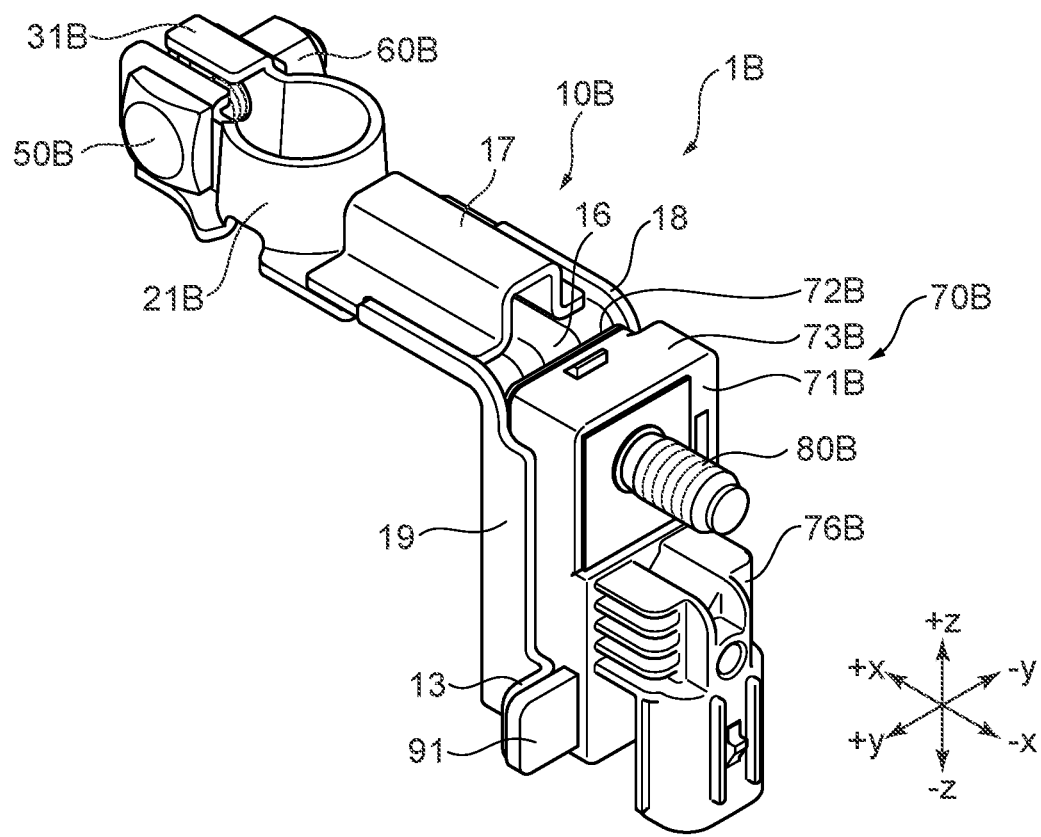
FIG. 15 A perspective view of the battery state detection device according to the second embodiment.
Figure 16:
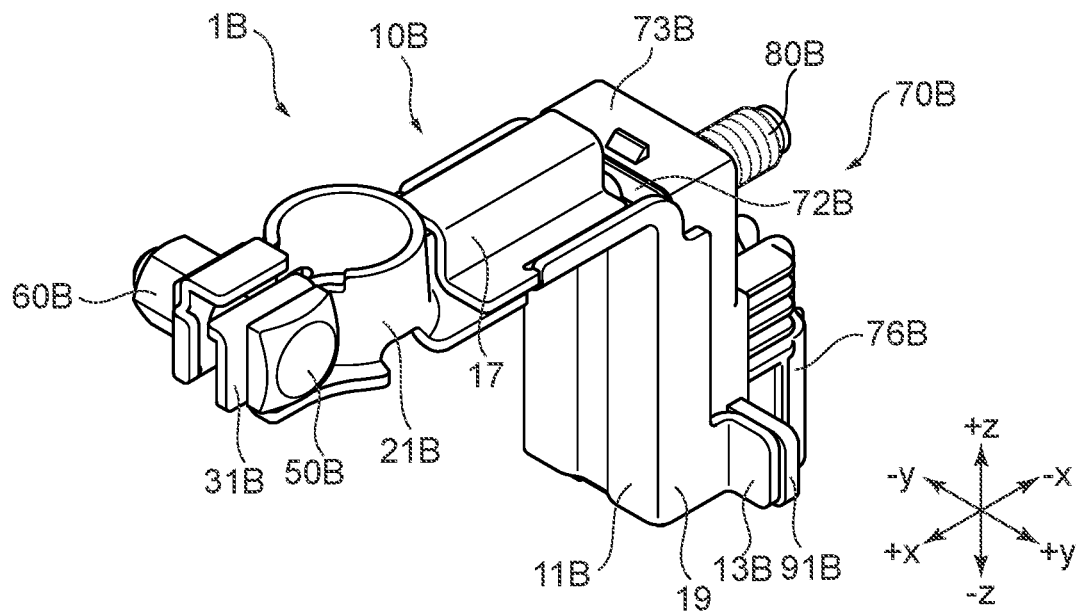
FIG. 16 A perspective view of the battery state detection device according to the second embodiment.
Figure 17:
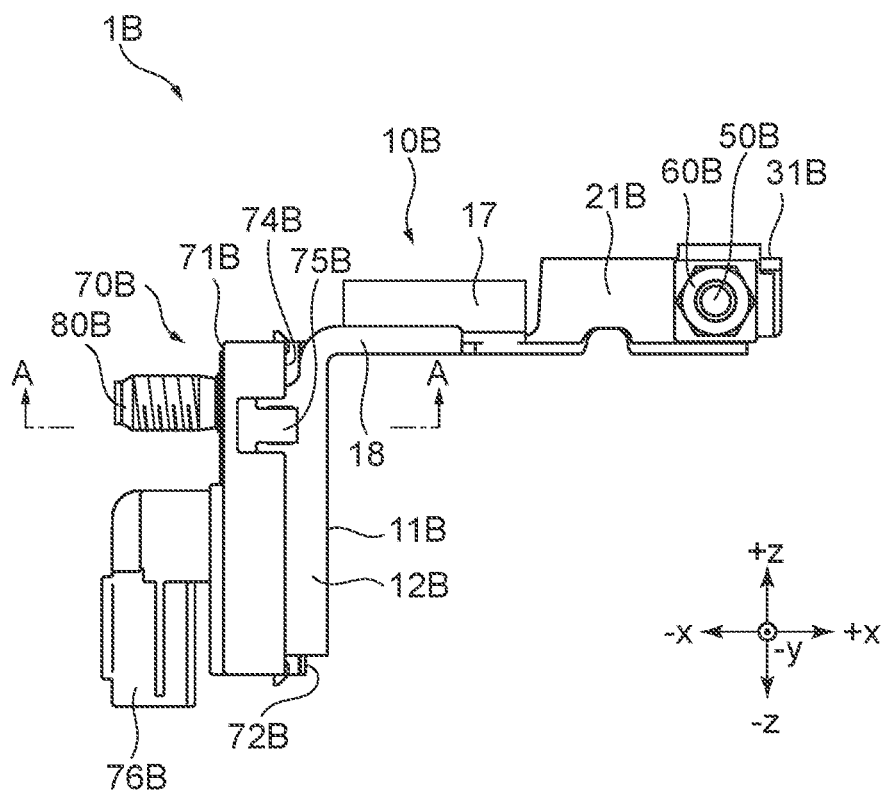
FIG. 17 A front view of the battery state detection device according to the second embodiment.
Figure 18:
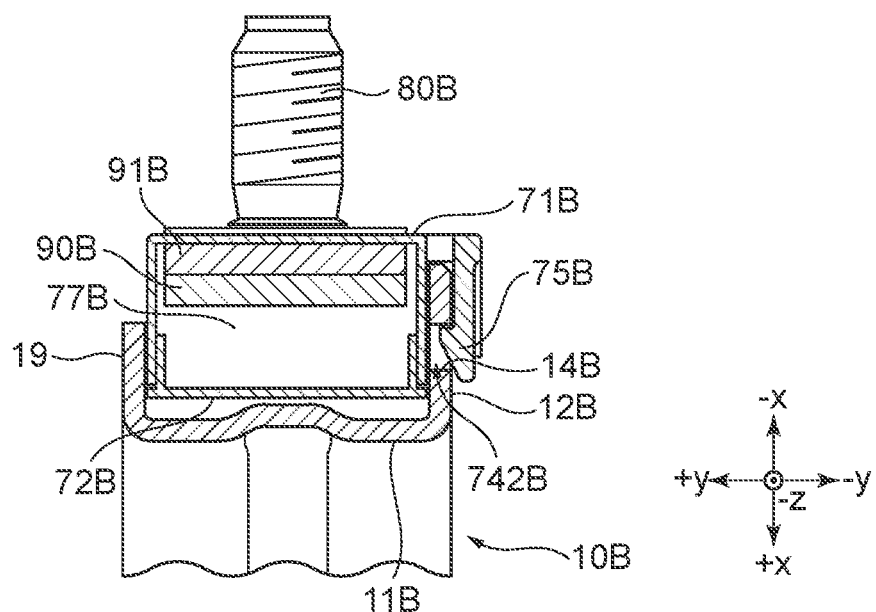
FIG. 18 An A-A cross-sectional view of the battery state detection device according to the second embodiment.

FIGS. 13 to 16 are perspective views of the battery state detection device 1B according to the second embodiment. FIG. 17 is a front view of the battery state detection device 1B. FIG. 18 is an A-A cross-sectional view of the battery state detection device 1B.

As illustrated in FIGS. 13 to 18, the battery state detection device 1B includes a battery post terminal 10B, a case 70B, which accommodates a circuit board including a current sensing circuit that senses a current by being electrically connected to the battery post terminal 10B, and a harness connection part 80B that is provided on the case 70B and to which a harness can be connected. The battery post terminal 10B includes an electrode fitting part 21B that fixes the battery post terminal 10B to a battery post, an extension part 16 extending from the electrode fitting part 21B, a holding part 11B that is provided by bending the extension part 16 and is joined to a bottom portion 72B of the case 70B so as to cover the bottom portion 72B, reinforcing parts 112 and 162 that reinforce the extension part 16 and the holding part 11B, and an insert part 12B provided such that it extends from the holding part 11B along a side face portion 73B of the case 70B. The case 70B includes a fitting part 74B that fits around the insert part 12B by accommodating the insert part 12B. Hereinafter, the battery state detection device 1B will be specifically described.

[Configuration of Case]

A specific configuration of the case 70B will be described.

Figure 19:
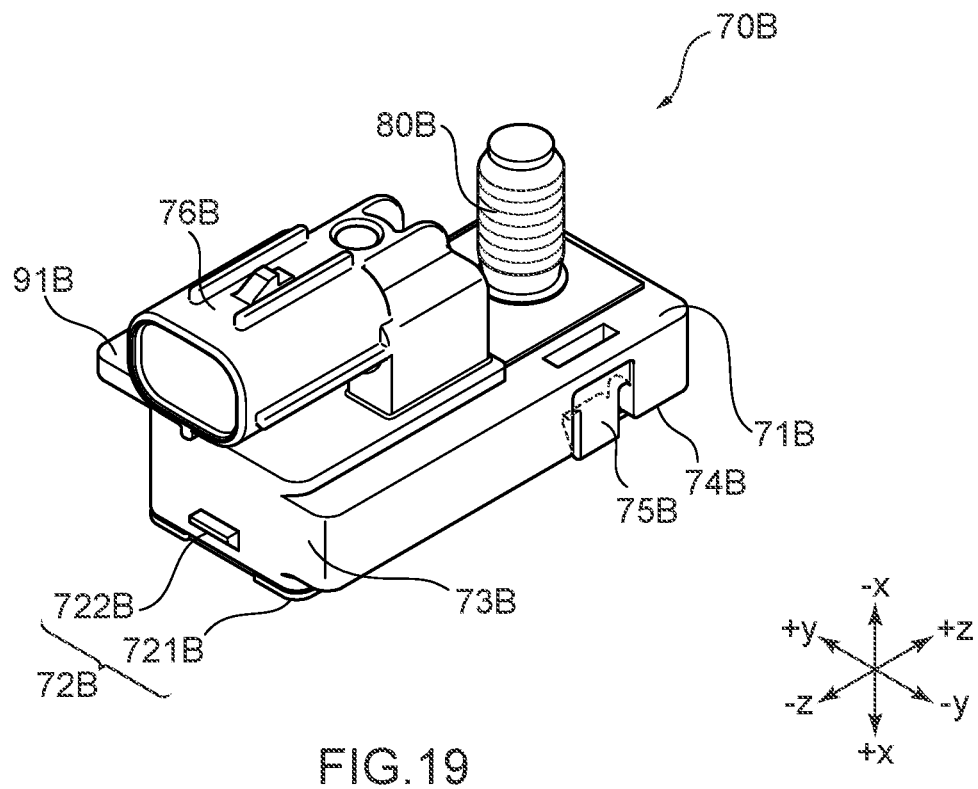
FIG. 19 A perspective view of a case of the battery state detection device according to the second embodiment.
Figure 20:
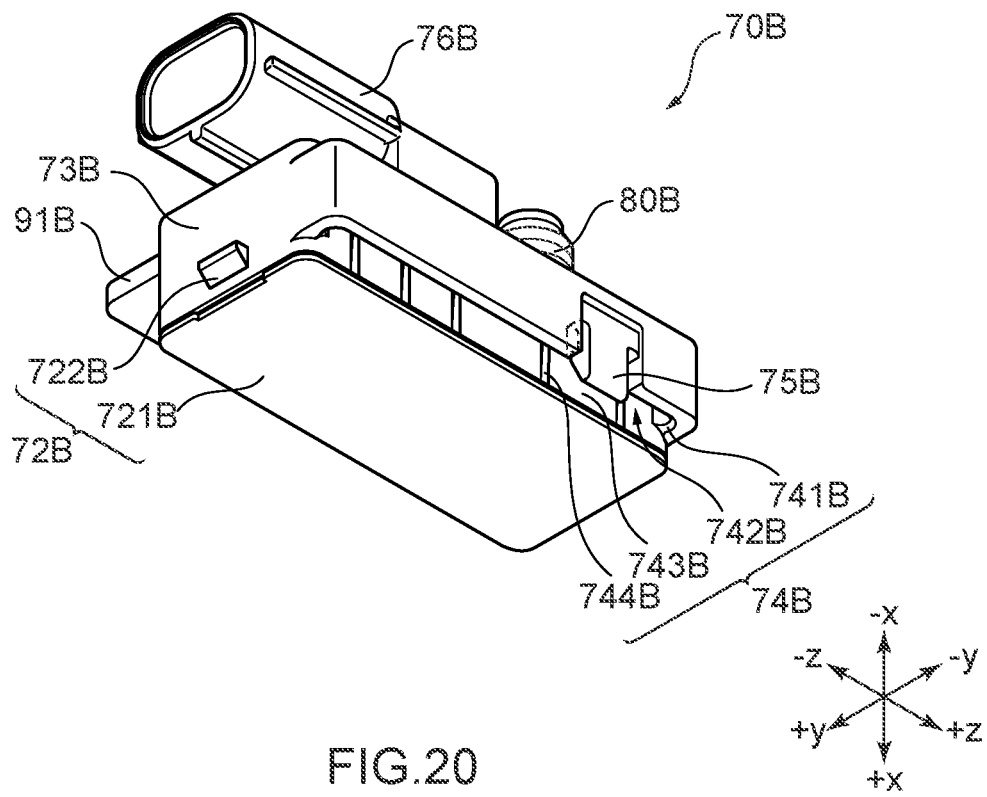
FIG. 20 A perspective view of the case of the battery state detection device according to the second embodiment.
Figure 21:
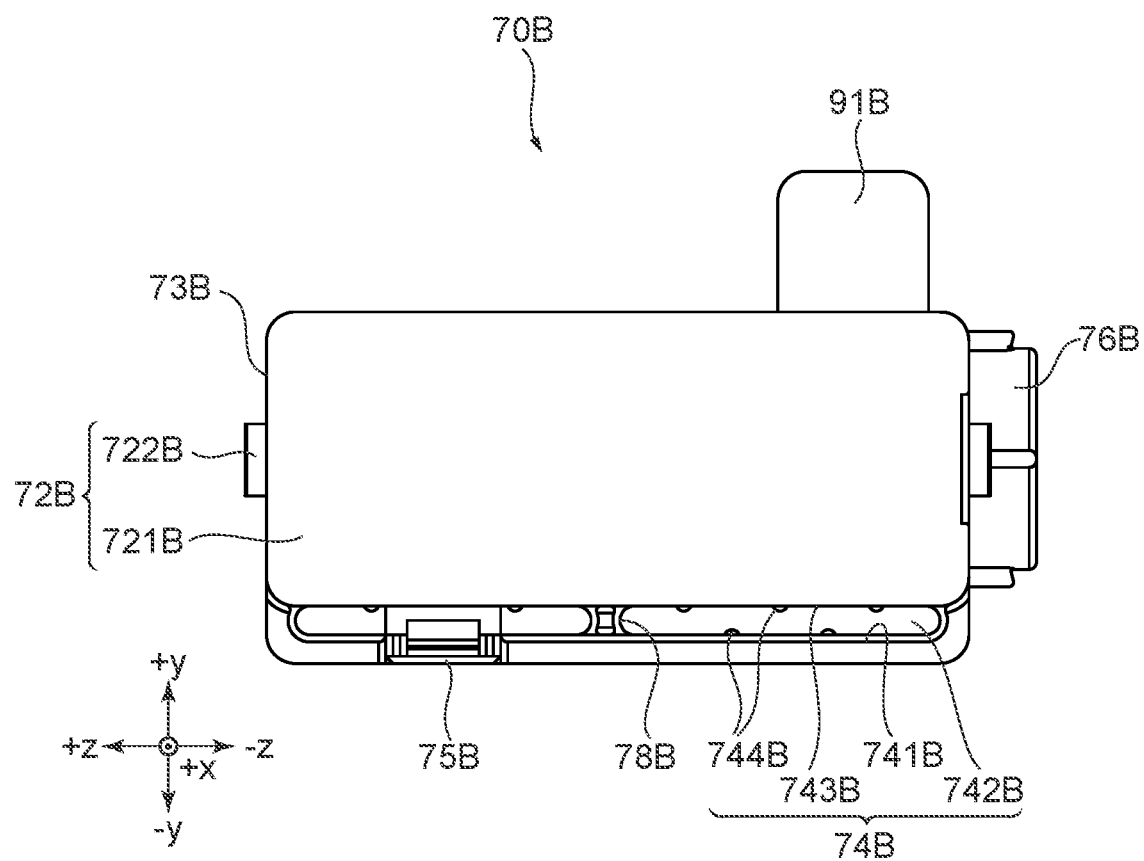
FIG. 21 A bottom view of the case of the battery state detection device according to the second embodiment.

FIGS. 19 and 20 are perspective views of the case 70B of the battery state detection device 1B. FIG. 21 is a bottom view of the case 70B of the battery state detection device 1B. The case 70B includes an upper face portion 71B, the bottom portion 72B, the side face portion 73B, the fitting part 74B, a locking part 75B, a connector part 76B, and a first rib 78B. The case 70B has an internal space (i.e., a substrate accommodating part 77B; see FIG. 18) surrounded by the upper face portion 71B, the bottom portion 72B, and the side face portion 73B. The case 70B is open on the side of the bottom portion 72B, and the substrate accommodating part 77B communicates with the outside through the opening. When the bottom portion 72B is fixed to the portion of the opening of the case 70B on the side of the bottom portion 72B, the substrate accommodating part 77B is closed from the outside. The case 70B is formed in the shape of a substantially rectangular parallelepiped box, for example. The case 70B is made of resin, for example.

As illustrated in FIG. 17, the substrate accommodating part 77B of the case 70B accommodates a circuit board 90B including a current sensing circuit that senses a current by being electrically connected to the battery post terminal 10B. The circuit board 90B has a shunt resistor 91B having disposed therein a resistive element (for example, Manganin) with a known resistance value. The shunt resistor 91B is electrically connected to the circuit board 90B, and is partially exposed to the outside of the case 70B through the side face portion 73B on the rear side of the case 70B as illustrated in FIGS. 15 and 16. The shunt resistor 91B is electrically connected to the battery post terminal 10B via a shunt resistor connection part 13B of the battery post terminal 10B.

As illustrated in FIGS. 19 to 21, the upper face portion 71B forms the upper face of the case 70B formed in the shape of a box. The upper face portion 71B has the connector part 76B formed thereon. In addition, the upper face portion 71B has the harness connection part 80B to which a harness (not illustrated) can be connected. It should be noted that the connector part 76B may be molded either integrally with or separately from the upper face portion 71B.

The bottom portion 72B is provided in the bottom face of the case 70B formed in the shape of a box, that is, provided facing the upper face portion 71B on the side below the upper face portion 71B. The bottom portion 72B is formed in a rectangular or substantially rectangular shape as seen from below. The bottom portion 72B closes the opening (not illustrated) provided on the lower side of the case 70B. The bottom portion 72B includes a bottom portion body 721B formed in a flat or substantially flat shape, for example, and a claw part 722B provided on the side face of the bottom portion body 721B on the short-side side. The claw part 722B is inserted into an insertion hole (not illustrated) provided in the side face portion 73B on the short-side side, thereby fixing the bottom portion 72B in the aforementioned opening of the case 70B.

The side face portion 73B forms the side face of the case 70B formed in the shape of a box. The side face portion 73B is provided continuously with the upper face portion 71B so as to surround the outer periphery of the upper face portion 71B. The side face portion 73B has on its front side the fitting part 74B into which the insert part 12B of the battery post terminal 10B is insertable, for example. A terminal of the shunt resistor 91B is exposed to the outside through the side face portion 73B on the rear side. In addition, the side face portion 73B has on its short-side side an insertion hole (not illustrated) into which the aforementioned claw part 722B is adapted to be inserted, for example.

The fitting part 74B is provided on the side face portion 73B of the case 70B, specifically, on the side face portion 73B on the front side. The fitting part 74B includes an opening 741B, an accommodating part 742B, an inner wall part 743B, second ribs 744B, and the locking part 75B.

The opening 741B is open to the lower side of the case 70B. The accommodating part 742B is adapted to have the insert part 12B of the battery post terminal 10B inserted therein as illustrated in FIGS. 13 to 17. Therefore, the accommodating part 742B is formed in the shape of a recessed groove with a predetermined depth so that the accommodating part 742B can accommodate the insert part 12B. The accommodating part 742B is provided with the inner wall part 743B to surround and accommodate the insert part 12B. The inner wall part 743B is provided with the plurality of second ribs 744B extending along the horizontal direction (i.e., the x-axis direction) with predetermined gaps therebetween, for accommodating the insert part 12B. The second ribs 744B are formed on the opposite sides of the inner wall part 743B in the accommodating part 742B. The second ribs 744B are provided to allow the plate-like insert part 12B, which has been inserted into the accommodating part 742B, to be press-fitted in the thickness direction (i.e., the y-axis direction). Therefore, in the accommodating part 742B, the distance between the opposite second ribs 744B in the y-axis direction is the same as or slightly smaller than the plate thickness of the insert part 12B.

It should be noted that the second ribs 744B are not limited to the ones provided away from each other in the z-axis direction on the opposite sides of the inner wall part 743B as illustrated in FIG. 21. That is, the second ribs 744B may be provided facing each other on the opposite sides of the inner wall part 743B.

The locking part 75B is locked in a fixation hole 14B of the insert part 12B inserted in the accommodating part 742B, thereby fixing the battery post terminal 10B and the case 70B together. The locking part 75B is provided at a position facing the fixation hole 14B of the insert part 12B in a state in which the insert part 12B is accommodated in the accommodating part 742B. Specifically, the locking part 75B is formed in the shape of a claw extending to the inner side of the case 70B, that is, the inner side of the accommodating part 742B so as to be locked in the fixation hole 14B provided in the insert part 12B.

The first rib 78B extends from the substrate accommodating part 77B to the fitting part 74B on the inner side of the upper face portion 71B. The first rib 78B is provided to reinforce the upper face portion 71B of the case 70B.

The harness connection part 80B is provided for connection of a harness (not illustrated) for electrical components. The shape and position of the harness connection part 80B are not particularly limited in the battery state detection device 1B.

[Configuration of Battery Post Terminal]

Next, a specific configuration of the battery post terminal 10B will be described.

Figure 22:
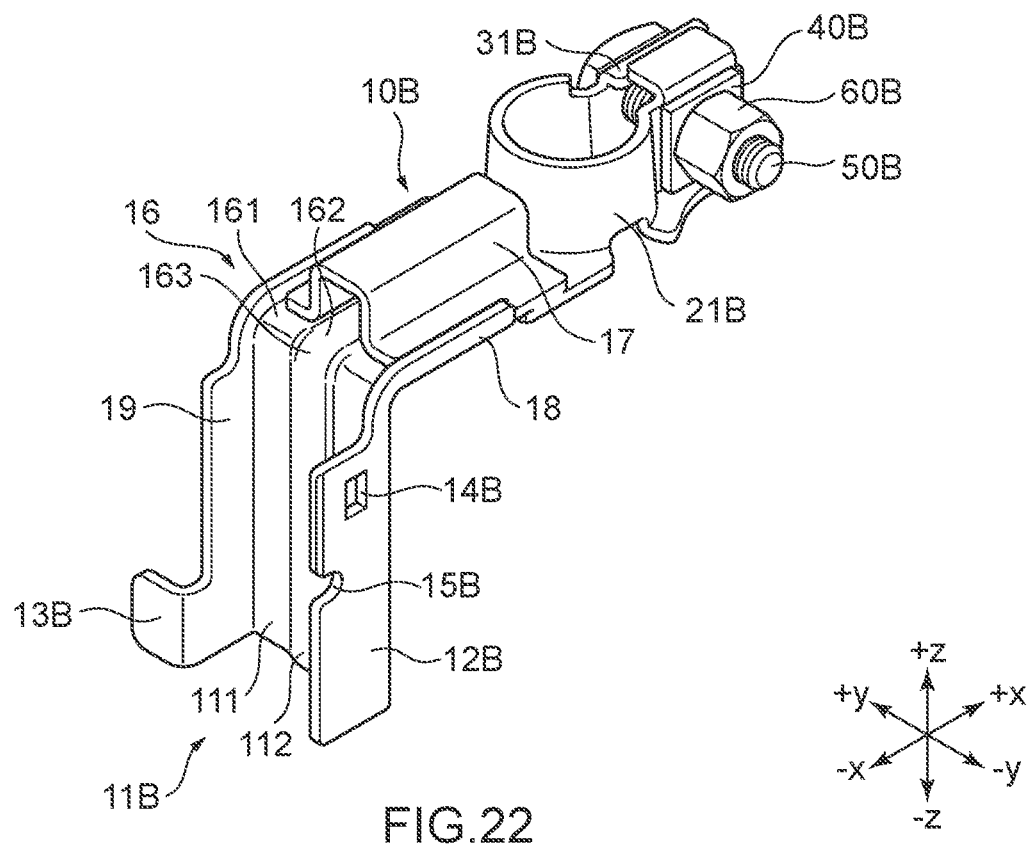
FIG. 22 A perspective view of a battery post terminal of the battery state detection device according to the second embodiment.
Figure 23:
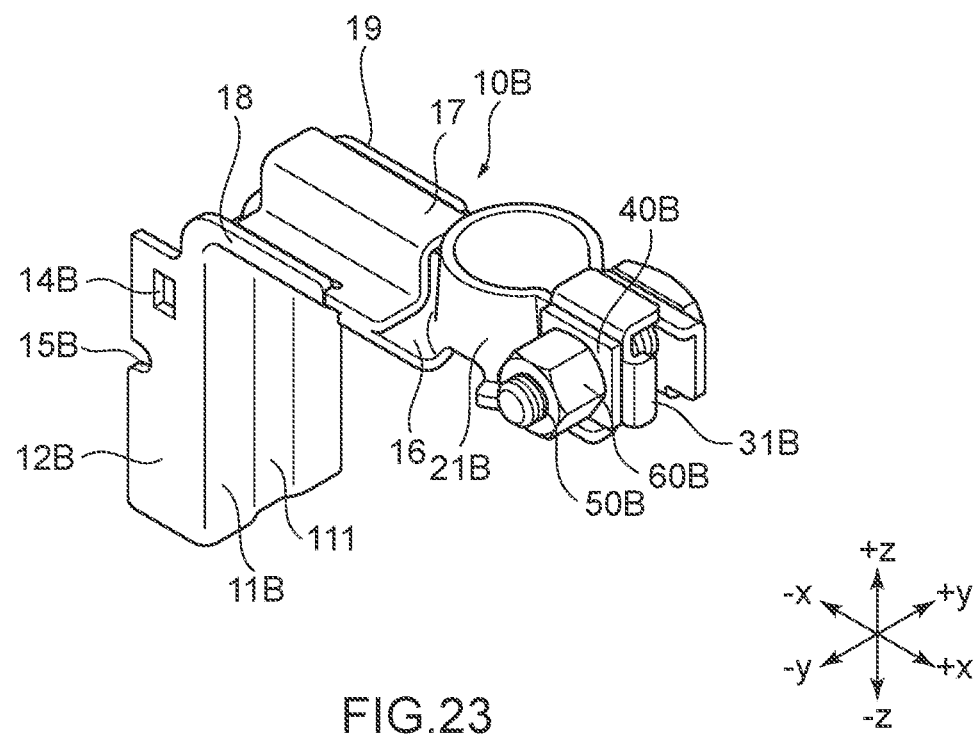
FIG. 23 A perspective view of the battery post terminal of the battery state detection device according to the second embodiment.

FIGS. 22 and 23 are perspective views of the battery post terminal 10B of the battery state detection device 1B. The battery post terminal 10B has a plate-like member 40B fastened thereto with a bolt 50B and a nut 60B as a fastening member in the front-rear direction. The battery post terminal 10B is formed of a conductive metal material. The battery post terminal 10B includes the electrode fitting part 21B provided on the right side in FIG. 22, the extension part 16 extending to the left side from the electrode fitting part 21B, the holding part 11B that is formed by bending the extension part 16 at a bent part 163 and has its longitudinal direction lying along the up-down direction (i.e., the z-axis direction), the insert part 12B located on the front side of the holding part 11B, and the shunt resistor connection part 13B located on the rear side of the holding part 11B. In addition, the battery post terminal 10B includes a fixation part 31B located on the right side of the electrode fitting part 21B. In the battery post terminal 10B, the holding part 11B, the insert part 12B, the shunt resistor connection part 13B, the fixation hole 14B, the extension part 16, the electrode fitting part 21B, and the fixation part 31B are integrally formed.

Herein, the extension part 16 and the holding part 11B of the battery post terminal 10B are formed along a planar portion of a housing of a battery (not illustrated) provided with the battery post. Specifically, the extension part 16 is formed along a face, which is provided with the battery post, of the housing of the battery, for example, the upper face of the housing of the battery, together with the electrode fitting part 21B. In addition, the holding part 11B is formed along a face connected to the face, which is provided with the battery post, of the housing of the battery, via a bent portion, for example, the side face of the housing of the battery.

The holding part 11B is provided by bending the extension part 16 at the bent part 163 in the downward direction (i.e., the z-axis direction). The holding part 11B is joined to the bottom portion 72B of the case 70B of the battery state detection device 1B so as to cover the bottom portion 72B. The holding part 11B is formed in a shape corresponding to the shape of the bottom portion 72B, for example, a rectangular or substantially rectangular shape. More specifically, the holding part 11B has a shape corresponding to the shape of the bottom face of the case 70B so as to cover the bottom portion 72B and the outer periphery of the bottom face of the case 70B. With such a shape, the holding part 11B is joined to the entire bottom face of the case 70B. The holding part 11B can be formed in any shape in conformity with the shape of the bottom portion 72B of the case 70B. The holding part 11B also serves as a structural member that supports the case 70B. The holding part 11B has the rib-like reinforcing part 112 formed thereon by bending a plate-like holding part body 111, which extends along the z-axis direction, along the longitudinal direction of the plate-like holding part body 111. The holding part 11B is provided with a standing wall part 19 extending from an end portion on the rear side.

The insert part 12B is a standing wall-like member that is bent at and extends from an end portion on the front side of the holding part 11B toward the upper face portion 71B along the side face portion 73B of the case 70B disposed above the holding part 11B. The insert part 12B is formed integrally with the holding part 11B, for example. The insert part 12B has a cutout part 15B at its end portion. The cutout part 15B is provided at a position facing the first rib 78B (see FIG. 21) provided in the accommodating part 742B of the fitting part 74B of the case 70B.

The shunt resistor connection part 13B is bent at and extends from an end portion of the standing wall part 19 to the rear side. The shunt resistor connection part 13B has a flat face along the horizontal direction and the up-down direction, and the face is electrically connected to the shunt resistor 91B that is exposed to the outside of the case 70B by extending outward through the side face portion 73B on the rear side in FIGS. 15 and 16 of the case 70B. The shunt resistor connection part 13B is provided at a position facing the side face portion 73B on the rear face side of the case 70B, for example. In the battery state detection device 1B, the shunt resistor connection part 13B and the shunt resistor 91B are electrically connected, so that the battery and the harness (which are not illustrated) are electrically connected.

The fixation hole 14B is a hole provided in the insert part 12B. The fixation hole 14B is provided at a position facing the locking part 75B when the insert part 12B is inserted into the fitting part 74B. The fixation hole 14B is adapted to have the locking part 75B locked therein and thus have the locking part 75B fixed therein. In the battery state detection device 1B, as the fixation hole 14B of the battery post terminal 10B and the locking part 75B of the case 70B are held, the case 70B is fixed to the battery post terminal 10B.

The electrode fitting part 21B fixes the battery post terminal 10B to the battery post (not illustrated). The electrode fitting part 21B is formed in a substantially frustum shape having an internal space in conformity with the shape of the battery post that is in a substantially frustum shape. The electrode fitting part 21B has formed in its center a circular fitting hole penetrating the space in the up-down direction. The inner peripheral surface of the electrode fitting part 21B is inclined so as to be in surface contact with the inclined outer peripheral surface of the battery post. In addition, the inner peripheral surface of the electrode fitting part 21B has a plurality of grooves with gaps therebetween in the circumferential direction, thereby increasing a fastening force for receiving the outer peripheral surface of the battery post. The electrode fitting part 21B is attached to the battery post such that the inner peripheral surface of the electrode fitting part 21B is covered from the upper side of the battery post.

Although the electrode fitting part 21B is formed integrally and continuously with the extension part 16 at a portion on the left side, the electrode fitting part 21B at a portion on the right side is branched (or split) to the front and rear across its inner peripheral surface. The fixation part 31B is formed such that it extends to the right side from each of the distal end portions of the electrode fitting part 21B branched to the front and rear.

The fixation part 31B is formed such that it extends to the right side from the electrode fitting part 21B and can accommodate a threaded portion of the bolt 50B therein. The fixation part 31B has the plate-like member 40B attached thereto.

The plate-like member 40B is formed in a substantially quadrangular shape, and has an insertion hole at its center. The insertion hole is adapted to have the threaded portion of the bolt 50B described below inserted therethrough. The plate-like member 40B is in surface contact with the fixation part 31B in a state in which the plate-like member 40B is attached to the fixation part 31B.

Figure 13:
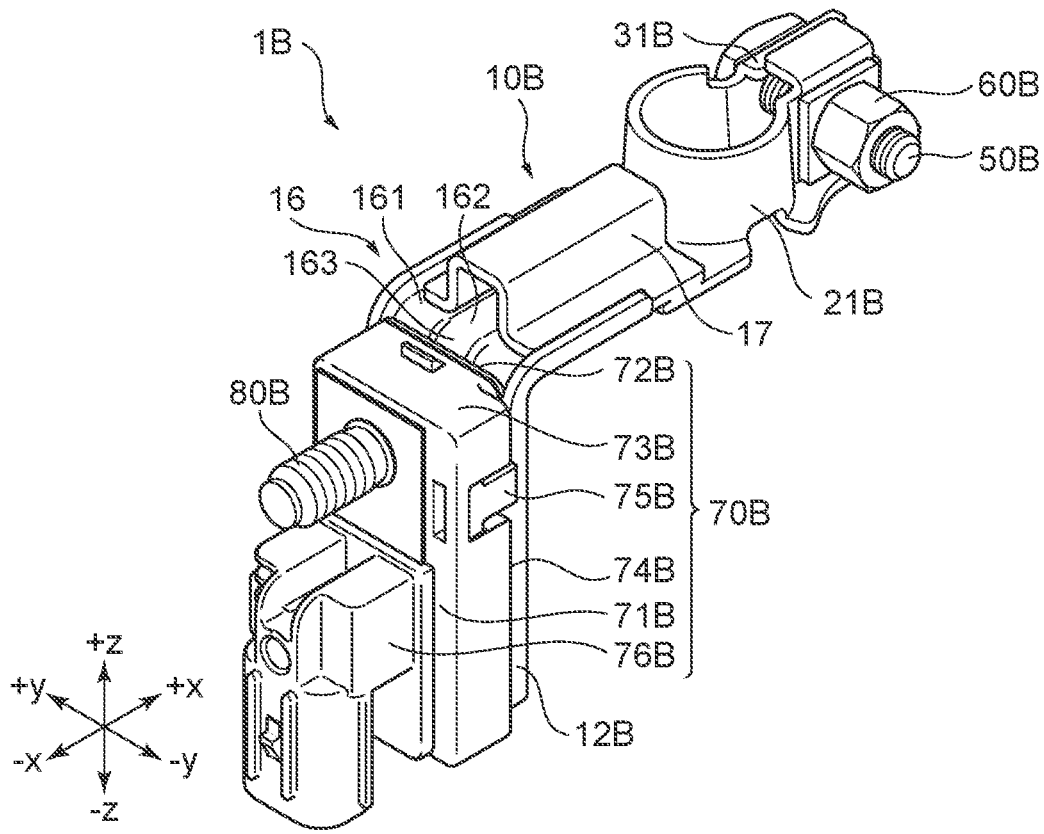
FIG. 13 A perspective view of a battery state detection device according to a second embodiment.
Figure 14:
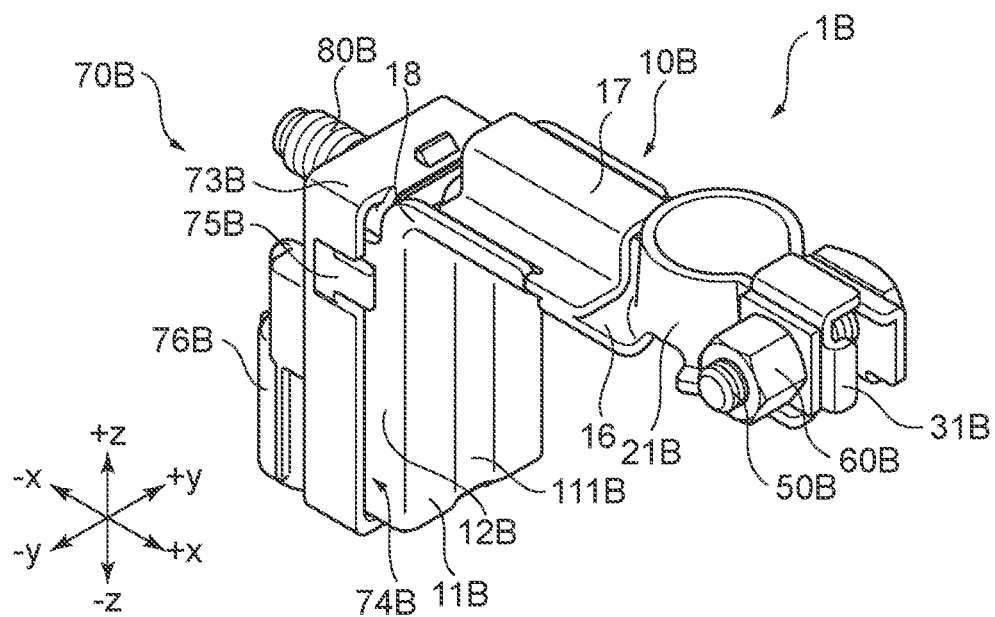
FIG. 14 A perspective view of the battery state detection device according to the second embodiment.

The bolt 50B includes, as illustrated in FIG. 13, the threaded portion extending in the front-rear direction, and a head portion located on the rear side of the threaded portion. The threaded portion has formed thereon a screw thread in the range of a predetermined length from the distal end portion of the threaded portion facing the front side.

The extension part 16 is provided such that it extends to the left side in the horizontal direction (i.e., the x-axis direction) from the electrode fitting part 21B. The extension part 16 includes a planar part 161, the reinforcing part 162, and the bent part 163. The planar part 161 is a substantially flat plate-like member lying along the horizontal direction and formed integrally with the electrode fitting part 21B.

The reinforcing part 162 is formed by bending the planar part 161 into a rib shape along the longitudinal direction (i.e., the x-axis direction). The bent part 163 is formed by bending an end portion on the left side of the planar part 161, which is opposite to an end portion on the right side in contact with the electrode fitting part 21B, in the downward direction (i.e., the −z-axis direction).

The upper face of the planar part 161 of the extension part 16 is provided with a reinforcing member 17 formed by bending a plate-like member made of metal. In addition, the extension part 16 is provided with a standing wall part 18 extending from the insert part 12B. Further, the extension part 16 is provided with a standing wall part 19 extending from the holding part 11B.

[Function of Battery State Detection Device]

Next, the function of the battery state detection device 1B in the second embodiment will be described.

Figure 24:
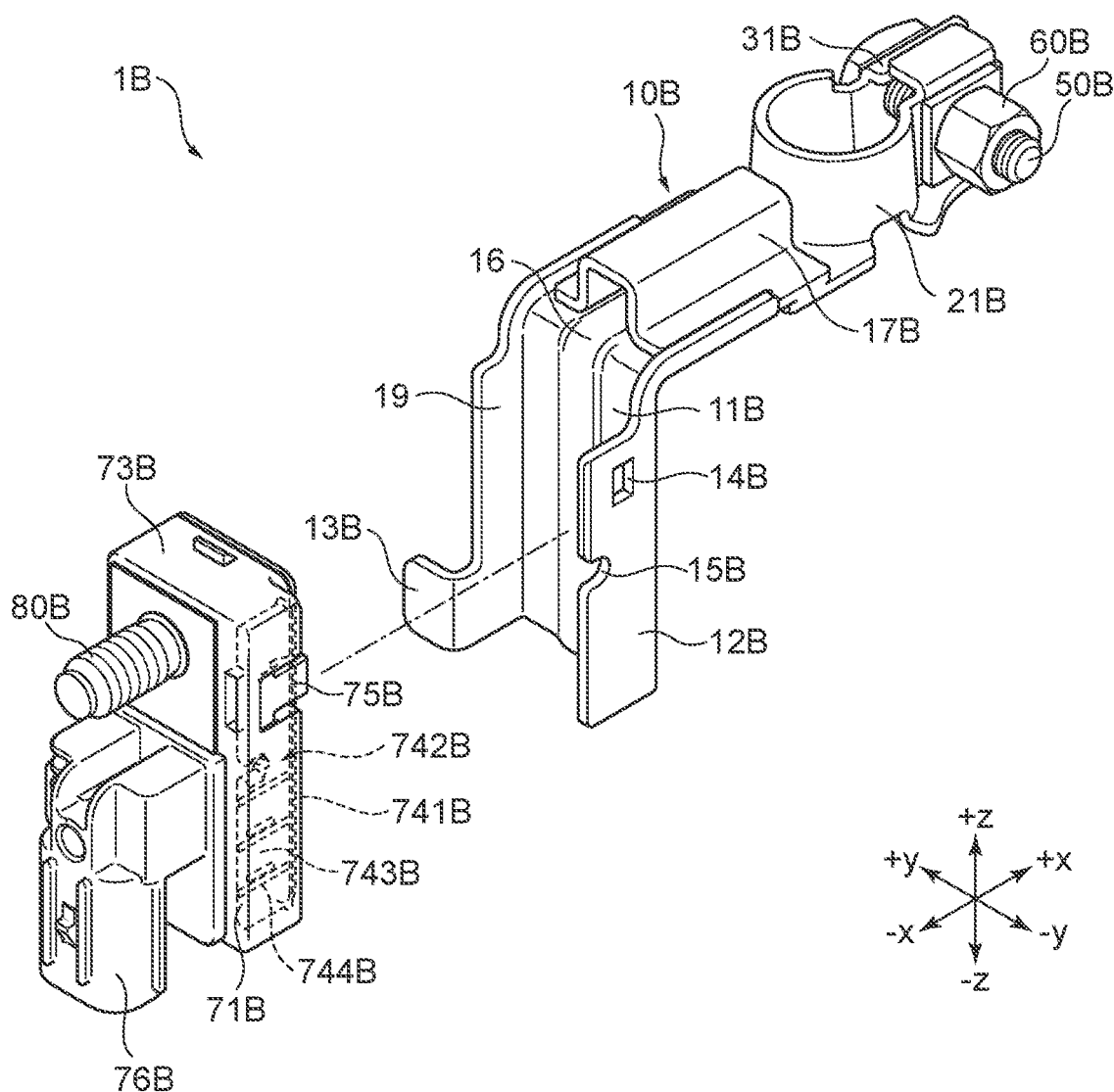
FIG. 24 An exploded perspective view of the battery state detection device according to the second embodiment.
Figure 25:
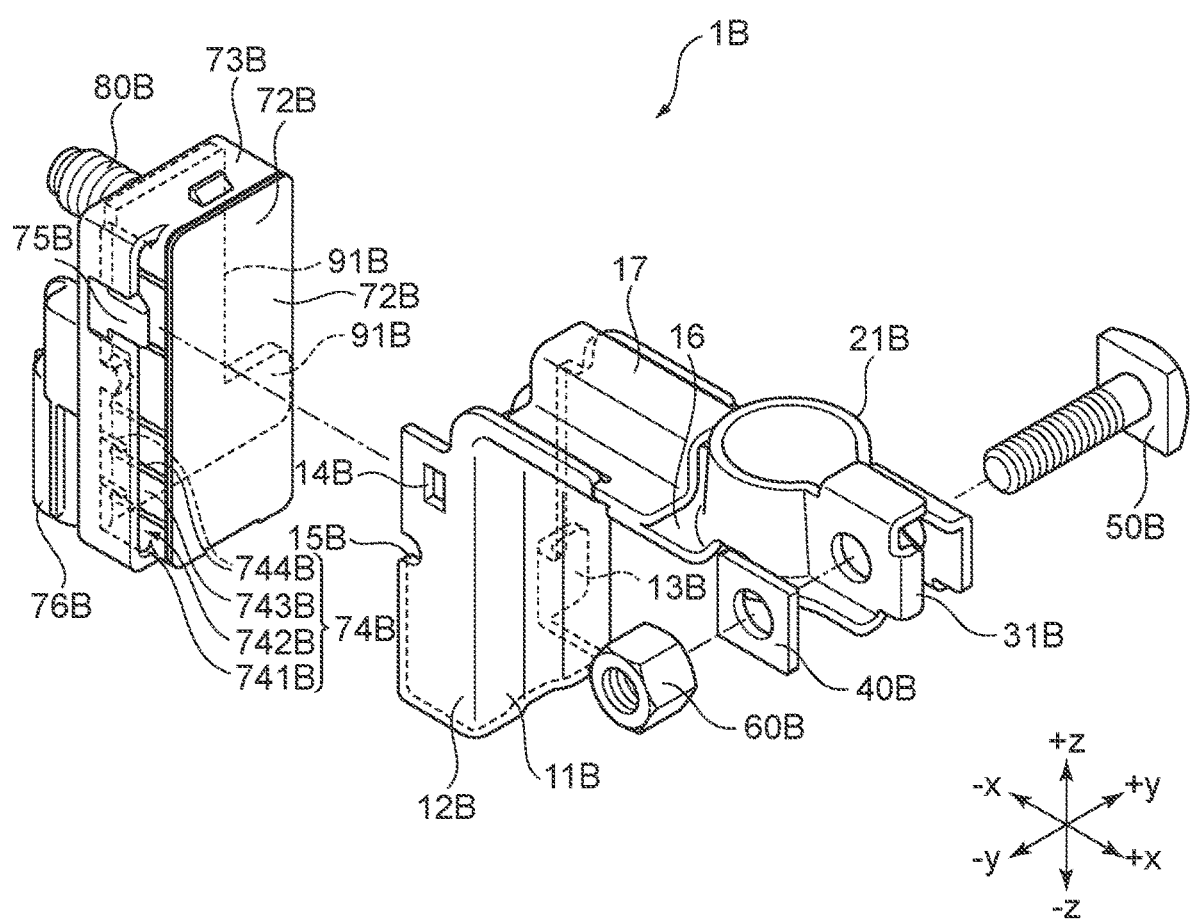
FIG. 25 An exploded perspective view of the battery state detection device according to the second embodiment.

FIG. 24 is an exploded perspective view of the battery state detection device 1B. FIG. 25 is an exploded perspective view of the battery state detection device 1B.

As illustrated in FIGS. 24 and 25, in the battery state detection device 1B, when the case 70B is attached to the battery post terminal 10B, the insert part 12B is accommodated in the accommodating part 742B, so that the case 70B is fixed to the battery post terminal 10B. At this time, the bottom portion 72B of the case 70B is joined to the holding part 11B of the battery post terminal 10B.

More specifically, the insert part 12B is accommodated in the accommodating part 742B through the opening 741B. When the insert part 12B is accommodated in the accommodating part 742B, the locking part 75B provided on the fitting part 74B is locked in the fixation hole 14B provided in the insert part 12B. In the accommodating part 742B, the position of the cutout part 15B provided at a distal end portion corresponds to the position of the first rib 78B provided on the inner side of the case 70B. Therefore, the insert part 12B is reliably accommodated in the accommodating part 742B.

With the aforementioned structure, in the battery state detection device 1B, the holding part 11B provided in the battery post terminal 10B made of metal is joined to the bottom portion 72B, which is the lower face portion, of the case 70B such that the holding part 11B covers the bottom portion 72B. According to such a configuration, the battery state detection device 1B can, when an operator detaches the battery state detection device 1B from the battery by holding the case 70B, receive a force of detaching the battery state detection device 1B with the holding part 11B made of metal. Specifically, according to the aforementioned battery state detection device 1B, a load applied when the battery state detection device 1B is detached from the battery can be distributed to the joined portion of the holding part 11B and the bottom portion 72B, specifically, to the outer peripheral portion of the bottom portion 72B of the case 70B. Thus, according to the aforementioned battery state detection device 1B, a load is less likely to be applied to the case 70B made of resin, and thus, the durability of the case 70B can be improved.

In addition, in the battery state detection device 1B, the insert part 12B of the battery post terminal 10B is accommodated in the accommodating part 742B of the fitting part 74B of the case 70B. Therefore, according to the battery state detection device 1B, a load applied when the battery state detection device 1B is detached from the battery can also be distributed to portions other than the joined portion of the holding part 11B and the bottom portion 72B.

Further, in the battery state detection device 1B, the fixation hole 14B provided in the insert part 12B of the battery post terminal 10B, and the locking part 75B provided in the case 70B are held. Therefore, according to the battery state detection device 1B, even when a load is applied to the case 70B while the battery state detection device 1B is detached from the battery, the case 70B can be prevented from falling off the battery post terminal 10B and thus being damaged.

Although the battery state detection device 1B according to the second embodiment of the present invention has been described above, the present invention is not limited thereto, and can be modified and changed in a variety of ways based on the technical idea of the present invention.

The shape of the holding part 11B of the battery post terminal 10B is not limited to the aforementioned rectangular or substantially rectangular shape, and it is acceptable as long as the holding part 11B has a shape corresponding to the shape of the bottom portion 72B so that the holding part 11B is joined to the outer peripheral portion of the bottom portion 72B of the case 70B and can distribute a force applied to the holding part 11B from the case 70B. In addition, the holding part 11B need not be an entirely flat plate without irregularities, and may be partially provided with holes or irregularities, for example. The shape of the insert part 12B is not limited to the aforementioned shape as long as the insert part 12B can be inserted into the fitting part 74B of the case 70B.

The shape of the fitting part 74B of the case 70B is not limited to the aforementioned shape, and it is acceptable as long as the fitting part 74B has a shape corresponding to the shape of the insert part 12B so that the fitting part 74B can fit around the insert part 12B. In addition, the positions and shapes of the fixation hole 14B and the cutout part 15B are not limited to the aforementioned shapes, either.

In the fitting part 74B of the case 70B, the inner wall part 743B may have the second ribs 744B at positions facing the insert part 12B in a state in which the insert part 12B is accommodated in the fitting part 74B. The second ribs 744B are crush ribs, and the distance therebetween in the y-axis direction on the opposite sides of the inner wall part 743B is the same as or slightly smaller than the plate thickness of the insert part 12B. Therefore, when the insert part 12B is accommodated in the accommodating part 742B of the fitting part 74B, the second ribs 744B as the crush ribs are scraped or squashed as the insert part 12B is press-fitted, so that the insert part 12B can be held more securely. The second ribs 744B are preferably triangular or semi-circular in shape, for example, as seen in a cross-sectional view, but the shapes of the second ribs 744B are not limited thereto.

The battery post terminal 10B may include the electrode fitting part 21B, the fixation part 31B, the plate-like member 40B, the bolt 50B, and the nut 60B with configurations different from those described above.

In addition, the case 70B may include the connector part 76B with a configuration different from that described above.

What is claimed is:

1. A battery state detection device comprising:
   a battery post terminal;
   a case accommodating a circuit board, the circuit board including a current sensing circuit that senses a current by being electrically connected to the battery post terminal; and
   a harness connection part provided on the case, the harness connection part being capable of having a harness connected thereto, wherein:

the battery post terminal includes a holding part held on a bottom of the case so as to cover an outer periphery of the bottom face of the case, and an insert part that is a wall-like member arranged on the holding part along a side face of the case, the battery post terminal contacts the case via at least two faces, the two faces including the one of the faces and the face adjacent to the one of the faces, and the case includes a fitting part, the fitting part being adapted to fit around the insert part by accommodating the insert part.

2. The battery state detection device according to claim 1, wherein the fitting part includes a locking part, the locking part being adapted to fix the insert part that has been inserted.

3. The battery state detection device according to claim 2, wherein:

the locking part is formed in a shape of a claw extending to an inner side of the case, and the insert part has a fixation hole provided at a position facing the locking part in a state in which the insert part is accommodated in the fitting part, the fixation hole being adapted to have the locking part locked and fixed therein.

4. The battery state detection device according to claim 1, wherein:

a shunt resistor electrically connected to the circuit board is partially exposed to an outside of the case, and the battery post terminal includes a shunt resistor connection part electrically connected to a part of the shunt resistor exposed from the case.

5. The battery state detection device according to claim 1, wherein:

the case includes a first rib on an inner side of an upper face of the case, the first rib extending to the fitting part, and the insert part has a cutout part at an end portion of the insert part, the cutout part being located at a position facing the first rib.

6. The battery state detection device according to claim 1, wherein:

the case includes a second rib on the fitting part, and the second rib is provided at a position facing the insert part in a state in which the insert part is accommodated in the fitting part.

7. The battery state detection device according to claim 1, wherein:

the battery post terminal includes an electrode fitting part adapted to fix the battery post terminal to a battery post, an extension part extending from the electrode fitting part, and a reinforcing part adapted to reinforce the extension part and the holding part, and the holding part is provided by bending the extension part.

8. The battery state detection device according to claim 7, wherein the reinforcing part is formed through bending along a longitudinal direction of the extension part and the holding part.

9. The battery state detection device according to claim 7, wherein the extension part is provided with a reinforcing member.

10. The battery state detection device according to claim 7, wherein the fitting part includes a locking part, the locking part being adapted to fix the insert part that has been inserted.

11. The battery state detection device according to claim 10, wherein:

the locking part is formed in a shape of a claw extending to an inner side of the case, and the insert part has a fixation hole provided at a position facing the locking part in a state in which the insert part is accommodated in the fitting part, the fixation hole being adapted to have the locking part locked and fixed therein.

12. The battery state detection device according to claim 7, wherein:

the case includes a shunt resistor electrically connected to the circuit board, the shunt resistor is partially exposed to an outside of the case through a side face of the case on a side opposite to the fitting part, and the battery post terminal includes a shunt resistor connection part provided on a side opposite to the insert part of the holding part, the shunt resistor connection part being electrically connected to a part of the shunt resistor exposed from the case.

13. The battery state detection device according to of claim 7, wherein the extension part and the holding part are formed along a housing of a battery provided with the battery post.

14. The battery state detection device according to claim 7, wherein:

the case includes a second rib on the fitting part, and the second rib is provided at a position facing the insert part in a state in which the insert part is accommodated in the fitting part.

* * * * *